(12) United States Patent
Kunikiyo

(10) Patent No.: US 6,620,703 B2
(45) Date of Patent: Sep. 16, 2003

(54) METHOD OF FORMING AN INTEGRATED CIRCUIT USING AN ISOLATION TRENCH HAVING A CAVITY FORMED BY REFLOWING A DOPED GLASS MASK LAYER

(75) Inventor: Tatsuya Kunikiyo, Chiyoda-Ku (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/117,185

(22) Filed: Apr. 8, 2002

(65) Prior Publication Data

US 2002/0135041 A1 Sep. 26, 2002

Related U.S. Application Data

(63) Continuation of application No. 09/084,969, filed on May 27, 1998, now abandoned.

(30) Foreign Application Priority Data

Dec. 24, 1997 (JP) .............................................. 9-354918

(51) Int. Cl.$^7$ ................................................ H01L 21/76
(52) U.S. Cl. ...................................... 438/422; 438/428
(58) Field of Search ................................ 438/424, 428, 438/433, 434, 435, 436, 421–422; 257/522

(56) References Cited

U.S. PATENT DOCUMENTS

| 5,504,033 | A | 4/1996 | Bajor et al. ................... 438/405 |
| 5,629,238 | A | 5/1997 | Choi et al. .................... 438/645 |
| 6,307,265 | B1 | 10/2001 | Anand et al. ................ 257/758 |
| 6,362,072 | B1 | * 3/2002 | Zambrano .................... 438/421 |
| 6,376,893 | B1 | * 4/2002 | Rha ............................ 438/422 |
| 6,406,975 | B1 | * 6/2002 | Lim et al. .................... 438/421 |

FOREIGN PATENT DOCUMENTS

| CN | 1157476 A | 8/1997 | |
| JP | 61-008945 | * 1/1986 | ........... H01L/21/76 |
| JP | 09-36073 | * 2/1997 | ......... H01L/21/304 |
| JP | 9-237831 | 9/1997 | |

\* cited by examiner

*Primary Examiner*—Wael Fahmy
*Assistant Examiner*—Anh Duy Mai
(74) *Attorney, Agent, or Firm*—Oblon, Spivak, McClelland, Maier & Neustadt, P.C.

(57) ABSTRACT

Isolation characteristics of an isolation trench can be enhanced. Elements to be isolated by an isolation trench (STI 2) are formed in active semiconductor regions shown by arrows 30 and 31 on a semiconductor substrate 1. The STI 2 is filled with SiOF.

2 Claims, 29 Drawing Sheets

METHOD OF FORMING AN INTEGRATED CIRCUIT USING AN ISOLATION TRENCH HAVING A CAVITY FORMED BY REFLOWING A DOPED GLASS MASK LAYER

CROSS-REFERENCE TO RELATED APPLICATIONS

This application is a continuation application of, and claims priority to, Ser. No. 09/084,969, filed May 27, 1998 now abandoned, on which an RCE was filed Jul. 9, 2001, and claims priority to Japanese Application No. JP 9-354918, filed Dec. 24, 1997. The entire contents of the parent application and the Japanese application are incorporated herein by reference.

BACKGROUND OF THE INVENTION

1. Field of the Invention

The present invention relates to a semiconductor integrated circuit and a semiconductor device, and a method for manufacturing the semiconductor integrated circuit and a method for manufacturing the semiconductor device, and more particularly to an isolation used for the semiconductor integrated circuit or the semiconductor device, a sidewall spacer of a MOS transistor, wirings for connecting elements of the semiconductor integrated circuit, and layer insulation of the wirings.

2. Description of the Background Art

FIGS. 36 and 37 are typical views showing an example of a semiconductor integrated circuit having an isolation region according to the prior art. FIG. 36 shows a planar layout of the semiconductor integrated circuit. FIG. 37 shows a sectional structure taken along the line A—A in FIG. 36.

A MOS transistor shown in FIGS. 36 and 37 is a component of a semiconductor memory cell, for example.

In FIGS. 36 and 37, the reference numeral 1 denotes a semiconductor substrate, the reference numeral 2 denotes a shallow trench isolation (hereinafter referred to as an STI) which is provided by forming a trench having a depth of about 0.2 to 0.3 μm on the semiconductor substrate 1 and burying an insulator in the trench, the reference numerals 3a to 3d denote source/drain regions formed on a principal plane of the semiconductor substrate 1, the reference numeral 4 denotes a gate oxide film stacked on the semiconductor substrate 1 or the STI 2, the reference numeral 5 denotes a polysilicon gate electrode stacked on the gate oxide film 4, the reference numeral 6 denotes a silicide film stacked on the polysilicon gate electrode 5, the reference numeral 7 denotes an oxide film stacked on the silicide film 6, the reference numeral 8 denotes a sidewall spacer formed on sidewalls of the gate oxide film 4, the polysilicon gate electrode 5, the silicide film 6 and the oxide film 7, the reference numeral 11 denotes an interlayer film formed by covering the principal plane of the semiconductor substrate 1, and the reference numeral 12 denotes a metal wiring formed on the interlayer film 11. In this specification, the STI represents a method for isolating a set of elements which are adjacent to each other. In addition, the STI also represents a structure used for the isolating method. The STI 2 is formed in a peripheral portion of an active semiconductor region including the source/drain regions 3a to 3d. A MOS transistor formed by the source/drain regions 3a to 3d, the semiconductor substrate 1, the gate oxide film 4 and the gate electrode 5 is used for a memory cell, for example.

The gate oxide film 4, the polysilicon gate electrode 5, the silicide film 6, the oxide film 7 and the sidewall spacer 8 form signal lines 9a to 9c. Examples of a material of the silicide film 6 include tungsten silicide (WSi) and titanium silicide (TiSi). In general, the oxide film 7 is made of a silicon oxide film (SiO). The silicon oxide film has a resistivity of about $2 \times 10^{16}$ Ω·cm.

A field transistor 10 shown in FIG. 37 comprises the STI 2, the wire 9b provided on the STI 2, and the source/drain regions 3b and 3c provided on both sides of the STI 2. The field transistor 10 is a parasitic transistor using a gate oxide film as the STI 2.

Operation of a semiconductor memory cell is affected by the following properties:

1. Isolation characteristics;
2. Wiring capacitance;
3. Gate-to-source capacity and gate-to-drain capacitance; and
4. Stress applied to a gate electrode by formation of silicide.

The operation of the semiconductor memory cell is greatly affected by a quantity of a leak current and a magnitude of an allowable voltage between elements isolated in the isolation region which are included in the isolation characteristics listed in the item 1. It is desirable that the allowable voltage between the elements isolated in the isolation region should be greater and a smaller quantity of the leak current should flow between the elements through the isolation region.

As a method for obtaining such desirable isolation characteristics, it is proposed that a threshold voltage of the field transistor 10 parasitic in the isolation region should be increased. A threshold voltage $V_{th}$ of a MOS transistor formed by using a silicon substrate is calculated by Equation 1, wherein the threshold voltage is represented by $V_{th}$, a Fermi level is represented by $\phi_f$, a flat band voltage is represented by $V_{FB}$, a gate capacitance is represented by $C_0$, a dielectric constant of silicon is represented by $K_{Si}$, a permittivity of a vacuum is represented by $\epsilon_0$, a unit charge is represented by q, an acceptor concentration is represented by $N_A$, and a source-to-substrate voltage is represented by $V_{BS}$. The dielectric constant $K_{Si}$ of the silicon is about 11.7.

$$V_{th} = 2\phi_f + V_{FB} + \frac{1}{C_0}\sqrt{2K_{Si} \cdot \varepsilon_0 \cdot q \cdot N_A \cdot 2\phi_f + V_{BS}} \quad (1)$$

The gate capacitance $C_0$ per unit area of the MOS transistor is calculated by Equation 2, wherein a dielectric constant of a silicon oxide film is represented by $K_{SiO2}$ and a thickness of a gate oxide film is represented by $t_{Ox}$. The dielectric constant $K_{SiO2}$ of the silicon oxide film is about 3.9.

$$C_0 = K_{SiO2} \cdot \varepsilon_0 \frac{1}{t_{OX}} \quad (2)$$

The gate oxide film of the field transistor 10 acts as the STI 2. Therefore, as the dielectric constant of the STI 2 is reduced, the threshold voltage of the field transistor 10 is increased. After all, a dielectric constant of an insulator forming the STI 2 should be reduced in order to increase a voltage which can be isolated by the STI 2 and to decrease the quantity of the leak current.

In general, it is required that a size of a DRAM should be reduced according to a change of generation of the DRAM. In order to reduce an opening width of the STI 2 by a scaling law, a permittivity of the STI 2 should be decreased. The reason is as follows. It is required that an opening width of a trench should be reduced and a depth of the trench should be decreased if a shape of the STI 2 is to be changed by the scaling law. However, this requirement causes the isolation characteristics to be deteriorated. If the opening width of the trench is reduced and the depth of the trench is increased, it becomes hard to fill the trench with an insulator.

For example, Japanese Patent Application Laid-Open Gazette No. 8-46028 has disclosed that a trench is filled with a material whose dielectric constant is less than 3.3, that is, a polyimide or polymeric spin-on glass (SOG) in place of silicon dioxide ($SiO_2$). However, it is difficult to fill the trench having a small opening width with an organic substance including a dielectric material such as the SOG. Furthermore, the disclosed element structure has no height difference between a semiconductor surface and a surface of the trench. Therefore, it is hard to perform mask alignment with high precision. For example, Japanese Patent Application Laid-Open Gazette No. 4-151850 has described an example in which a vacancy exists in a PSG (silicate glass) in an isolation trench. However, the vacancy described in the publication is generated by chance on only a part of the PSG in the isolation trench and is not intended to reduce a permittivity of the isolation trench. In particular, the invention described in the publication relates to a manufacturing method for preventing the vacancy formed on a bottom of the isolation trench from rising to a surface by reflow of the PSG, wherein the isolation trench is enlarged corresponding to the vacancy. A sectional area of the PSG through which an electric field is mainly transmitted is not reduced as compared with the prior art. Thus, the publication has not disclosed a method for manufacturing a semiconductor integrated circuit which can reduce the permittivity of the isolation trench.

As a method for enhancing the isolation characteristics, Japanese Unexamined Patent Publication No. 5-160251 has disclosed an isolation trench having a void 25 on the inside as shown in FIGS. 38 and 39, for example. In order to form such an isolation trench, a passivation layer 20 is first formed on a semiconductor substrate 1. Then, a patterned resist is used to form a trench by anisotropic etching. At this time, the passivation layer 20 remains on the semiconductor substrate 1 on which no trench is formed. A region in which the passivation layer 20 remains includes an active semiconductor region on which a semiconductor device such as a transistor is to be formed. After an oxide film 21 is formed on an internal wall of the trench, the void 25 is partially filled with a water-soluble glass and is subjected to etch-back. Then, a silicon dioxide layer 23 is provided by using a CVD method. In that case, the silicon dioxide layer 23 is provided in such a manner that films to be provided on both sidewalls have inclinations which are equal to each other. The water-soluble glass is removed through an opening which reaches the water-soluble glass and a silicon dioxide layer 24 is provided by the CVD method. Thus, an isolation trench having the void 25 is formed in the semiconductor substrate 1. The silicon dioxide layers 23 and 24 are polished and flattened by CMP (Chemical Mechanical Polishing). The passivation layer 20 is removed by etching. Thereafter, a transistor or the like is formed in an active semiconductor region 26 as shown in FIG. 39. This method has a problem in that a complicated step of removing the water-soluble glass by using two kinds of CVD methods should be performed if the isolation trench is to be changed into a void. According to a trench structure shown in FIGS. 38 and 39, a surface of the semiconductor substrate 1 and the silicon oxide film 21 intersect each other at an almost right angle. For this reason, an electric field concentrates. If the electric field concentrates in a trench edge, the following phenomena are observed. More specifically, a hump is generated in a gate voltage-drain current characteristic of the transistor, and a reverse narrow channel effect becomes remarkable, that is, a threshold voltage is dropped if a gate width of the transistor is reduced.

The wiring capacitance listed in the item 2 is one of important factors which determine an operating speed of a semiconductor integrated circuit having a large number of transistors. In general, metal is often used for the wire 12 shown in FIG. 37, and oxide is often used for an interlayer film provided between the wires or between the wire and the semiconductor substrate. For example, in the case where a silicon oxide film is used between the wires, a wiring capacitance Cw per unit area is calculated by Equation 3, wherein a wiring distance is represented by $t_{ox}$ and other reference numerals have the same definition as those in the Equation 2. The silicon oxide film has a great dielectric constant, for example, of about 3.9. Therefore, operation of the semiconductor integrated circuit is delayed.

$$C_W = \varepsilon_0 \cdot K_{SiO2} \frac{1}{t_{0X}} \quad (3)$$

For example, Japanese Patent Application Laid-Open Gazette No. 3-156929 has described a method for manufacturing a semiconductor device having a vacancy on an interlayer film in order to reduce a wiring capacitance. According to the manufacturing method, aluminum is directly formed, by sputtering, on the interlayer film with the vacancy opened. According to such a manufacturing method, it is necessary to form a vacancy having a small diameter on the interlayer film in such a manner that the vacancy is not filled with the aluminum. If a small cavity is formed by the vacancy, the effects of a reduction in the wiring capacitance are decreased. The problem that the effects of the reduction in the wiring capacitance are decreased with the small cavity also applies to the invention described in Japanese Patent Application Laid-Open Gazette No. 5-283542. Japanese Patent Application Laid-Open Gazette No. 63-318752 has disclosed the invention in which a vacancy is provided between adjacent wirings on the same layer to reduce a wiring capacitance. A plasma CVD SiN film, a plasma CVD SiO film, an atmospheric CVD SiO film and an atmospheric CVD PSG film are formed on the condition of poor height difference covering properties. By using such a method, there is a higher possibility that defective insulation might be caused because the wires cannot fully be covered due to the poor height difference covering properties.

The operating speed of the MOS transistor is greatly affected by the gate-to-source capacitance and gate-to-drain capacitance listed in the item 3. These capacities are parasitic capacities, and are preferably small in order to increase the operating speed of the MOS transistor. Referring to FIG. 37, the gate-to-source capacitance and the gate-to-drain capacitance are generated between the gate/drain regions 3c and 3d interposing the sidewall spacer 8 therebetween and the polysilicon gate electrode 5. By analogical application of the Equation 2, it is apparent that these capacities are reduced if a dielectric constant of the sidewall spacer 8 is decreased.

In order to decrease the dielectric constant of the sidewall spacer 8, it is preferable that a void should be provided on the sidewall spacer 8 in the same manner as in the isolation trench, for example. By way of example, Japanese Patent Application Laid-Open Gazette No. 63-211676 has disclosed a method for manufacturing a MOS transistor comprising a sidewall spacer having a cavity portion. However, even if a lightly doped drain (LDD) structure is formed with the cavity portion provided, an impurity concentration of the source/drain region fluctuates with difficulty.

U.S. Pat. No. 5,516,720 has disclosed a method for manufacturing a MOS transistor comprising a sidewall spacer having a void formed therein. However, the void is only a part of the sidewall spacer and is not formed in a portion which is in contact with a semiconductor substrate. A material making the sidewall spacer adheres to the semiconductor substrate. While impurities are implanted into the semiconductor substrate during formation of the LDD structure, damages remain on the sidewall spacer.

The stress applied to a gate electrode by formation of silicide which has been listed in the item 4 reduces a mobility of carriers (electrons or holes) traveling in a channel. Referring to FIG. 37, stress applied to the gate electrode 5 generates stress on an interface between the gate oxide film 4 and the semiconductor substrate 1. Therefore, the above-mentioned phenomenon occurs. In order to reduce resistance values of the signal wires 9a to 9c, the silicide film 6 is formed on the gate electrode 5. In that case, the following steps are performed. Consequently, the stress is applied to the gate electrode 5. More specifically, refractory metal such as tungsten (W) or titanium (Ti) is provided on the polysilicon gate electrode 5, and heat treatment such as RTA (Rapid Thermal Anneal) is performed to cause polysilicon and the refractory metal to chemically react, thereby forming silicide (WSi, TiSi or the like).

For example, Japanese Patent Application Laid-Open Gazette No. 4-151866 has disclosed that a slit or a hole is provided on a wiring layer (guard ring) to relax stress in a corner portion and the like. However, the disclosed slit width ranges from 20 µm to 40 µm. Accordingly, it is hard to form a slit on a wire whose width is less than about 0.1 µm, for example, by using the technique described in the publication.

The isolation trench of the semiconductor integrated circuit according to the prior art has the above-mentioned structure. Because of etching damages and contact of materials having different coefficients of volumetric expansion, infinitesimal defects are generated on an internal wall of the trench during etching and heat treatment.

In the method for manufacturing a semiconductor integrated circuit according to the prior art, in the case where the void is to be provided to reduce the permittivity of the isolation trench, the step of providing the void on the isolation trench is complicated so that manufacture is hard to carry out.

In the semiconductor integrated circuit according to the prior art, furthermore, there has been a problem that the operating speed of the semiconductor integrated circuit is reduced by the interlayer film provided between the wirings or between the wiring and the semiconductor substrate.

The method for manufacturing a semiconductor device according to the prior art has the following problem. More specifically, if impurities are implanted to form the source/drain region after the sidewall spacer is changed into the void, it is hard to form the LDD structure having a sufficient difference between impurity concentrations of the source/drain regions. In addition, if a size of the void is reduced to form the LDD structure having a sufficient difference in the impurity concentration, the sidewall spacer damaged by ion implantation remains in the source/drain region. For this reason, an interface state is generated on an interface between the sidewall spacer and the silicon substrate so that a part of electrons flowing from a source into a drain are captured by the interface state, thereby causing scattering of a drain current flowing in the vicinity of the interface. Consequently, a magnitude of the drain current is reduced.

In the semiconductor device and the method for manufacturing the semiconductor device according to the prior art, stress is applied to the gate electrode so that the mobility of the carriers in the semiconductor substrate provided under a gate insulation film is decreased. Consequently, current driving force of the transistor is reduced.

SUMMARY OF THE INVENTION

A first aspect of the present invention is directed to a semiconductor integrated circuit comprising a semiconductor substrate having a predetermined principal plane, a plurality of elements provided on the predetermined principal plane, and an isolation trench provided on the predetermined principal plane for isolating the elements, wherein the isolation trench is filled with fluoride.

A second aspect of the present invention is directed to the semiconductor integrated circuit according to the first aspect of the present invention, wherein the fluoride is SiOF.

A third aspect of the present invention is directed to the semiconductor integrated circuit according to the first or second aspect of the present invention, further comprising an oxide film formed on an internal wall of the isolation trench by oxidizing the semiconductor substrate.

A fourth aspect of the present invention is directed to a method for manufacturing a semiconductor integrated circuit, comprising the steps of forming an insulation film on a principal plane of a semiconductor substrate on which a plurality of elements are provided, forming a reflow glass on the insulation film, forming, on the principal plane, an isolation trench having a bottom face inside the semiconductor substrate through the reflow glass and the insulation film to isolate the elements, and blocking the isolation trench above the bottom face by causing the reflow glass to be subjected to reflow.

A fifth aspect of the present invention is directed to the method for manufacturing a semiconductor integrated circuit according to the fourth aspect of the present invention, wherein the reflow glass is a boron phosphosilicate glass.

A sixth aspect of the present invention is directed to a semiconductor integrated circuit comprising a semiconductor substrate having a predetermined principal plane, a first wire provided above the semiconductor substrate, a second wire provided between the semiconductor substrate and the first wire, and a supporter isolated from the second wire for supporting the first wire on the semiconductor substrate, wherein the first wire and the second wire are insulated from each other by only a predetermined gas with which a layer space formed between the first wire and the second wire at a predetermined distance from the predetermined principal plane is filled.

A seventh aspect of the present invention is directed to the semiconductor integrated circuit according to the sixth aspect of the present invention, wherein the first wire includes a plurality of bit lines, and the second wiring includes a plurality of word lines.

An eighth aspect of the present invention is directed to a method for manufacturing a semiconductor integrated circuit, comprising the steps of forming an interlayer film on a first wiring layer, forming a reflow glass film on the interlayer film, forming a plurality of trenches perpendicularly to the interlayer film and the reflow glass film, forming a cavity on the trenches by causing the reflow glass film to be subjected to reflow, flattening the reflow glass film after the reflow, and forming a second wiring layer on the reflow glass film after the flattening.

A ninth aspect of the present invention is directed to a method for manufacturing a semiconductor device, comprising the steps of forming a gate electrode on a predetermined principal plane of a semiconductor substrate, forming a first sidewall spacer to cover the gate electrode, forming a second sidewall spacer to cover the first sidewall spacer and to come in contact with the semiconductor substrate, implanting an impurity into the semiconductor substrate by using the gate electrode and the first sidewall spacer as masks to form a source and a drain, and removing the first sidewall spacer.

A tenth aspect of the present invention is directed to the method for manufacturing a semiconductor device according to the ninth aspect of the present invention, wherein the step of forming a source and a drain is performed by using both the first and second sidewall spacers as masks.

An eleventh aspect of the present invention is directed to the method for manufacturing a semiconductor device according to the ninth aspect of the present invention, the step of forming a source and a drain is performed by using only the first sidewall spacer as a mask.

A twelfth aspect of the present invention is directed to a semiconductor device comprising a semiconductor substrate having a predetermined principal plane, stacked layers provided on the predetermined principal plane and including a gate electrode, and a dome-shaped sidewall spacer covering the stacked layers, wherein the sidewall spacer is isolated from the stacked layers by a cavity.

A thirteenth aspect of the present invention is directed to a method for manufacturing a semiconductor device, comprising the steps of preparing a semiconductor substrate having, a predetermined principal plane, forming a gate insulation film on the predetermined principal plane, forming a polysilicon film on the gate insulation film, forming a metal film having a void on the polysilicon film, and siliciding the polysilicon film and the metal film by reaction.

A fourteenth aspect of the present invention is directed to the method for manufacturing a semiconductor device according to the thirteenth aspect of the present invention, further comprising a step of forming a sidewall spacer which is higher than the metal film on sidewalls of the gate insulation film, the polysilicon film and the metal film provided on the predetermined principal plane of the semiconductor substrate, wherein the step of forming the metal film includes a step of providing the metal film in a concave portion enclosed by the sidewall spacer and the polysilicon film.

A fifteenth aspect of the present invention is directed to a semiconductor device comprising a semiconductor substrate having a predetermined principal plane, a gate insulation film provided on the predetermined principal plane, a polysilicon film provided on the gate insulation film, and a silicide film provided on the polysilicon film, wherein the silicide film has a void.

According to the first aspect of the present invention, dangling bonds can be decreased by the SiOF with which the isolation trench is filled, and a leak current flowing between the elements isolated by the isolation trench can be reduced.

According to the second aspect of the present invention, a dielectric constant of the SiOF is smaller than that of silicon dioxide. Therefore, isolation characteristics of the isolation trench can be enhanced.

According to the third aspect of the present invention, the isolation trench can be protected by the oxide film. In addition, the dangling bonds generated between the oxide film and the semiconductor substrate can be decreased to reduce the leak current between the elements.

According to the fourth aspect of the present invention, the void can simply be formed between the reflow glass and the bottom face of the trench in such a manner that the reflow glass does not enter the bottom face of the trench during the reflow of the reflow glass.

According to the fifth aspect of the present invention, the boron phosphosilicate glass easily causes overhang. Therefore, manufacturing conditions can be relaxed.

According to the sixth aspect of the present invention, a capacity between the first and second wirings can be reduced by the layer space filled with the predetermined gas. Thus, an operating speed of the semiconductor integrated circuit can be enhanced.

According to the seventh aspect of the present invention, a plurality of bit lines and a plurality of word lines are provided so that their superposition is increased. Consequently, the operating speed can be enhanced still more.

According to the eighth aspect of the present invention, the trench can easily be changed into the void by the reflow of the reflow glass.

According to the ninth aspect of the present invention, the first sidewall spacer damaged by the implantation of the impurity is removed. Therefore, it is possible to prevent characteristics of the semiconductor device from being deteriorated by the damage of the first sidewall spacer.

According to the tenth aspect of the present invention, impurity diffusion can be prevented during the formation of the second sidewall spacer, and a size of the device can easily be reduced.

According to the eleventh aspect of the present invention, the second sidewall spacer is not damaged during the implantation of the impurity. Consequently, the characteristics of the semiconductor device can be prevented from being deteriorated.

According to the twelfth aspect of the present invention, the sidewall spacer isolated from the stacked layers by the void transmits stress from the outside to neither the stacked layers nor the gate electrode. Therefore, the leak current can be reduced when the semiconductor device is off.

According to the thirteenth aspect of the present invention, less impurities can be taken into the suicide when the polysilicon is silicided, and a variation in a threshold voltage of a transistor can be reduced.

According to the fourteenth aspect of the present invention, the metal film can easily be formed in the void.

According to the fifteenth aspect of the present invention, the void is formed on the silicide layer. Therefore, stress applied to the gate electrode can be relaxed, and defects and an interface state generated by the stress can be reduced. Consequently, the leak current can be reduced when the semiconductor device is off.

In order to solve the above-mentioned problems, it is an object of the present invention to reduce a leak current caused by infinitesimal defects which are generated due to etching damages on an internal wall and contact of materials having different coefficients of volumetric expansion in an isolation trench of a semiconductor integrated circuit.

It is another object of the present invention to simplify a step of providing a void in an isolation trench to easily manufacture a semiconductor integrated circuit.

It is yet another object of the present invention to enhance an operating speed of a semiconductor integrated circuit by changing, into a void, an interlayer film provided between wirings or between the wiring and a semiconductor substrate.

It is a further object of the present invention to eliminate the cause of scattering of a drain current flowing in the vicinity of an interface by removing a sidewall spacer damaged by ion implantation, thereby preventing the drain current from being reduced.

It is a further object of the present invention to relax stress applied to a gate electrode to prevent a mobility of carriers in a semiconductor substrate provided under a gate insulation film from being reduced and to prevent current driving force of a transistor from being reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A semiconductor integrated circuit according to a first embodiment of the present invention which will be described below comprises at least two elements and an isolation trench for isolating the elements. The isolation trench is filled with fluoride, that is, SiOF.

In particular, there will be described the case where effects of the present invention are greatly produced, that is, the case where the isolation trench is an STI to be formed on a silicon substrate.

Figure 1:
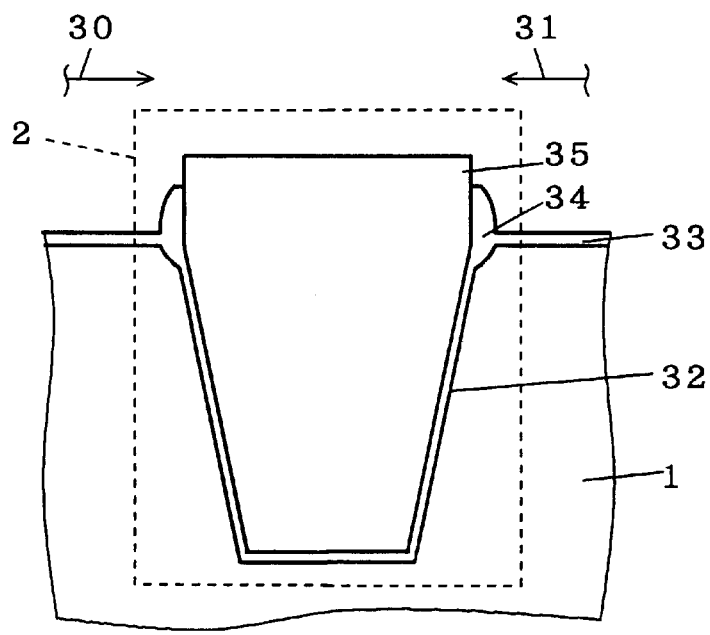
FIG. 1 is a typical view showing an example of a sectional structure of an STI according to a first embodiment.

FIG. 1 is a typical view showing an example of a structure of the semiconductor integrated circuit according to the first embodiment. FIG. 1 shows an enlarged section in the vicinity of an STI 2 formed in the semiconductor integrated circuit. In a semiconductor substrate 1, elements to be isolated by the STI 2 are formed in active semiconductor regions shown by arrows 30 and 31.

The STI 2 includes a silicon oxide film 32 formed on a sidewall of the trench, silicon oxide 34 formed in the vicinity of a boundary between a principal plane of the semiconductor substrate 1 and the trench, and SiOF 35 filled into the trench like a band extending in a vertical direction on a paper. The silicon oxide 34 is formed around an opening of the trench and serves to relax an electric field concentrating in the semiconductor substrate 1 around the opening of the trench.

When the STI 2 is to be formed, infinitesimal defects are generated on a material interface during etching and heat treatment because an internal wall is damaged by the etching and materials having different coefficients of volumetric expansion (the semiconductor substrate 1 and the silicon oxide film 32) are in contact with each other in the trench (silicon (Si) has a coefficient of volumetric expansion of about $3.1 \times 10^{-6}$, and silicon dioxide ($SiO_2$) and SiOF have coefficients of volumetric expansion of about $1.2 \times 10^{-7}$.

However, when the SiOF 35 is buried in the trench, fluorine ions are generated. The fluorine ions are coupled onto dangling bonds of silicon atoms. Consequently, a leak current flowing between the elements formed in the regions shown by the arrows 30 and 31 is reduced.

SiOF has a dielectric constant of about 2.0 to 3.0. If a material having a smaller dielectric constant than a dielectric constant of a silicon oxide film is buried, parasitic coupling of adjacent transistors through the STI 2 is reduced more than in the prior art. In the STI 2 according to the first embodiment, thus, isolation characteristics can further be enhanced. Accordingly, it is preferable that the STI 2 should be filled with fluoride, that is, the SiOF.

$SiO_2$ has a resistivity of about $2 \times 10^{16}$ Ω·cm. SOG has a resistivity of about $1 \times 10^{-}$ to $1 \times 10^{-}$ Ω·cm. SiOF has a resistivity of about $2 \times 10^{x}$ Ω·cm. Therefore, the resistivity does not cause the isolation characteristics to be deteriorated as compared with the prior art.

With reference to FIGS. 2 to 5, a method for manufacturing the STI 2 filled with the SiOF 35 will be described below. A semiconductor substrate 1 is thermally oxidized to form a silicon oxide film 33 having a thickness of about 0.01 μm on a principal plane of the semiconductor substrate 1. Furthermore, a polysilicon film 36 having a thickness of about 0.03 μm and a nitride film 37 having a thickness of about 0.02 μm are sequentially provided. A resist 38 having a thickness of about 0.06 μm is formed on the nitride film 37 and is then subjected to patterning. Anisotropic etching is performed by using the patterned resist 38 as a mask. Thus, a trench 39 is formed (see FIG. 2). The trench 39 has a width of about 0.2 μm and a depth of about 0.2 μm from the principal plane of the semiconductor substrate 1.

Figure 2:
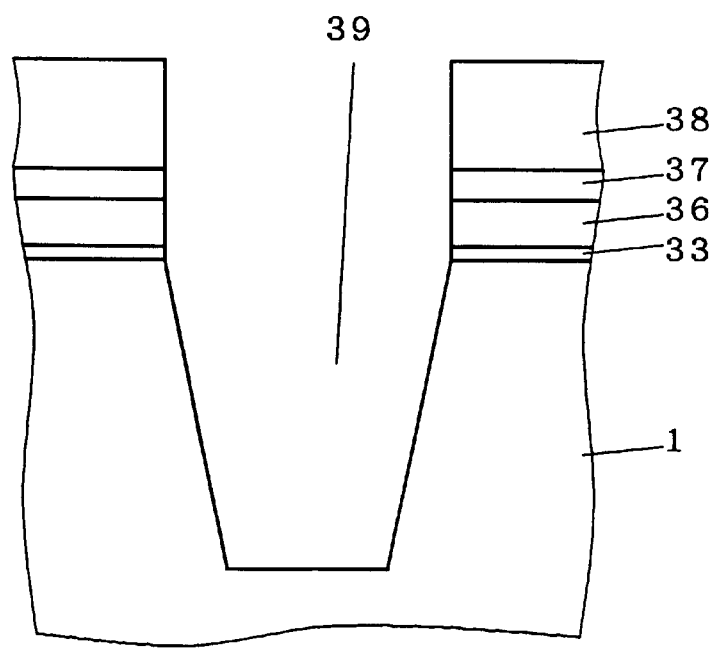
FIGS. 2 to 5 are typical views showing steps of manufacturing the STI according to the first embodiment.
Figure 3:
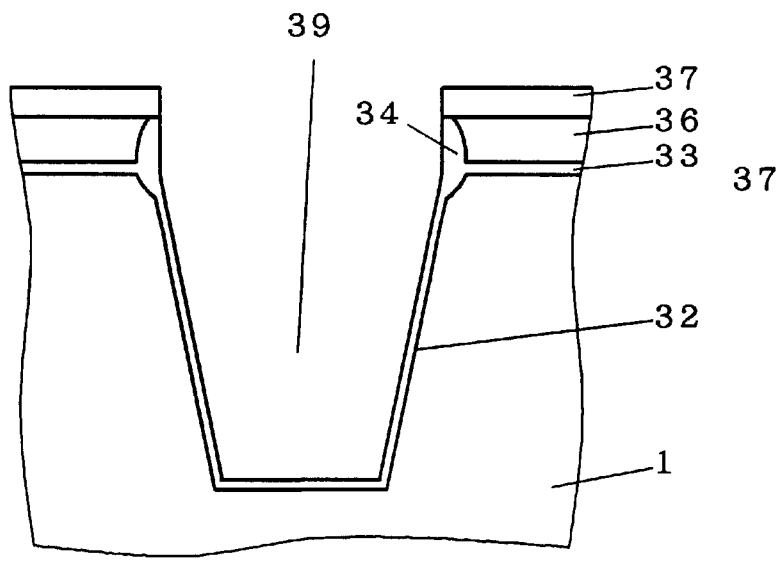

After the resist 38 is removed in a state shown in FIG. 2, internal walls of the trench 39) and the polysilicon film 36 are thermally oxidized so that a silicon oxide film 32 having a thickness of about 0.005 μm is formed (see FIG. 3). The silicon oxide film 32 serves to protect the internal wall of the trench 39. For example, the oxide film 32 prevents the internal wall from being damaged when an insulator is buried in the trench 39. At the same time, the oxide film 32 prevents the internal wall of the trench 39 from being contaminated by heavy metal (Ti, Co, W and the like) existing on the outside of the semiconductor substrate 1. As the internal wall of the trench 39 is oxidized, a region (the internal wall of the trench 39) damaged during formation of the trench 39 is also oxidized. This region is taken into the oxide film 32. Accordingly, the internal wall of the semiconductor substrate 1 is less damaged by etching.

At an end of the trench 39, silicon oxide 34 protrudes from the principal plane of the semiconductor substrate 1. The silicon oxide 34 acts as a sidewall of the STI 2 so that an electric field of the STI 2 can be inhibited from concentrating in a boundary between the trench 39 and the principal plane of the semiconductor substrate 1.

Figure 4:
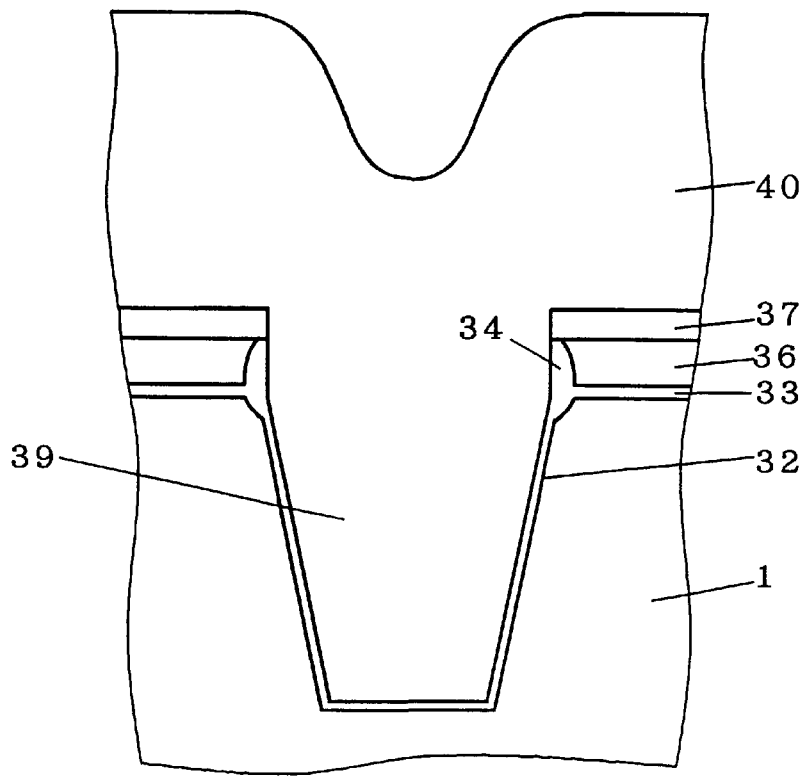
Figure 5:
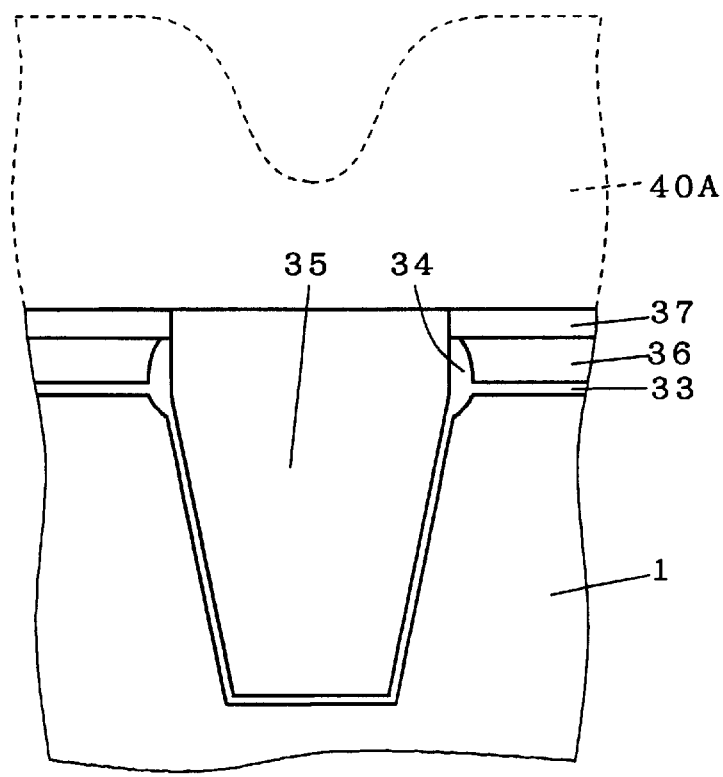

Then, a SiOF film 40 is provided over the whole face of the principal plane of the semiconductor substrate 1 by a CVD method to fill in the trench 39 (see FIG. 4). The SiOF film 40 shown in FIG. 4 is flattened by chemical mechanical polishing (CMP). During the flattening, the nitride film 37 is used as a stopper for the CMP. Therefore, a SiOF film 40A provided on the nitride film 37 is removed so that SiOF 35 is formed (see FIG. 5). The nitride film 37 used as the stopper and the polysilicon film 36 are removed by etching so that the STI 2 shown in FIG. 1 is formed. Thereafter, mask alignment for forming an element on the semiconductor substrate 1 call easily be performed because the STI 2 has a height difference.

Second Embodiment

Figure 38:
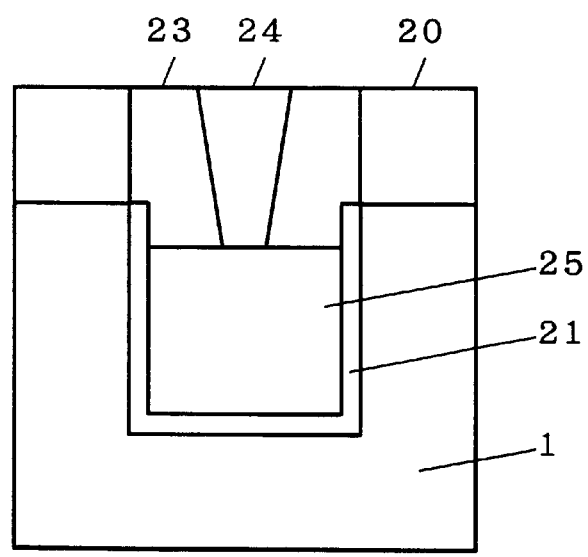
FIGS. 38 and 39 are sectional views showing steps of manufacturing a trench isolation according to the prior art.
Figure 39:
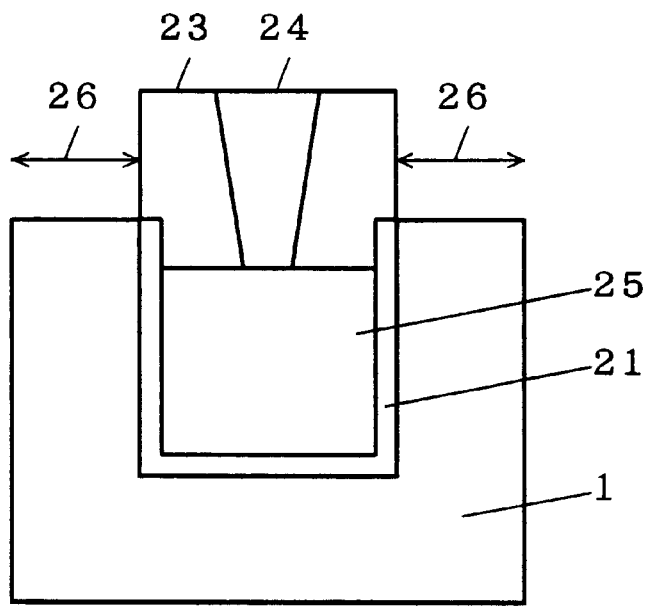

In the first embodiment, the dielectric constant of the SiOF buried in the STI 2 is smaller than that of $SiO_2$ used in the prior art so that the isolation characteristics can be enhanced. As an example, air has a very small dielectric constant. The case where the isolation trench according to the prior art shown in FIGS. 38 and 39 has a cavity on the inside has been described in the Background Art.

However, the method for manufacturing an isolation trench having a cavity according to the prior art is complicated. In a method for manufacturing a semiconductor integrated circuit according to a second embodiment, a step of forming a cavity of an STI is simplified.

FIGS. 6 to 11 are typical views showing each step of the method for manufacturing the semiconductor integrated circuit according to the second embodiment. FIGS. 6 to 11 show an enlarged section of a semiconductor substrate in the vicinity of the STI in the same manner as in FIGS. 1 to 5 used for the description of the first embodiment. In FIGS. 6 to 11, the same reference numerals as those in FIGS. 1 to 5 denote the same portions as those in FIGS. 1 to 5, and the portions have almost the same sizes as those in FIGS. 1 to 5.

Figure 6:
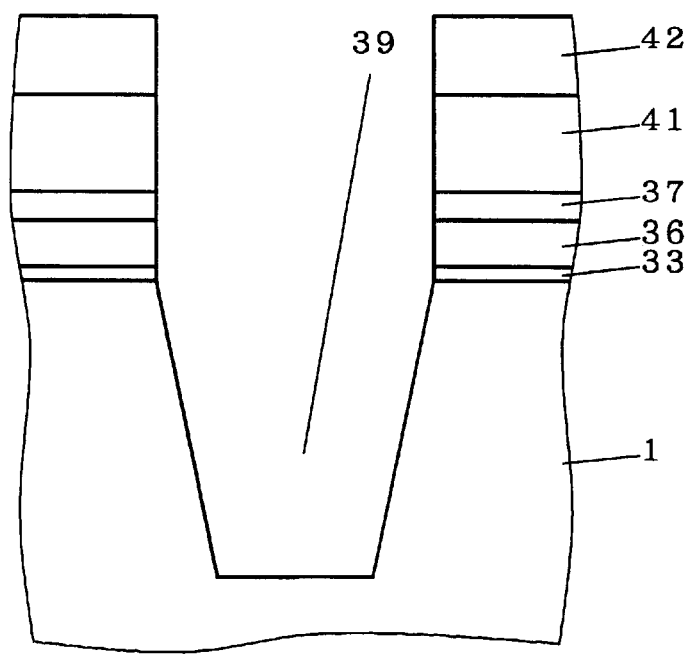
FIGS. 6 to 11 are typical views showing steps of manufacturing an STI according to a second embodiment.

First of all, a semiconductor substrate 1 having a trench 39 formed thereon as shown in FIG. 6 is prepared. A silicon oxide film 33, a polysilicon film 36, a nitride film 37, a BPSG film 41 and a resist 42 are sequentially provided upward on a principal plane of the semiconductor substrate 1. The BPSG film 41 has a thickness of about 0.08 μm and the resist 42 has a thickness of about 0.06 μm. Anisotropic etching is performed bay using the patterned resist 42 as a mask. The films 33, 36, 37 and 41 are also bored so that a trench 39 having a bottom face on the semiconductor substrate 1 is formed.

Figure 7:
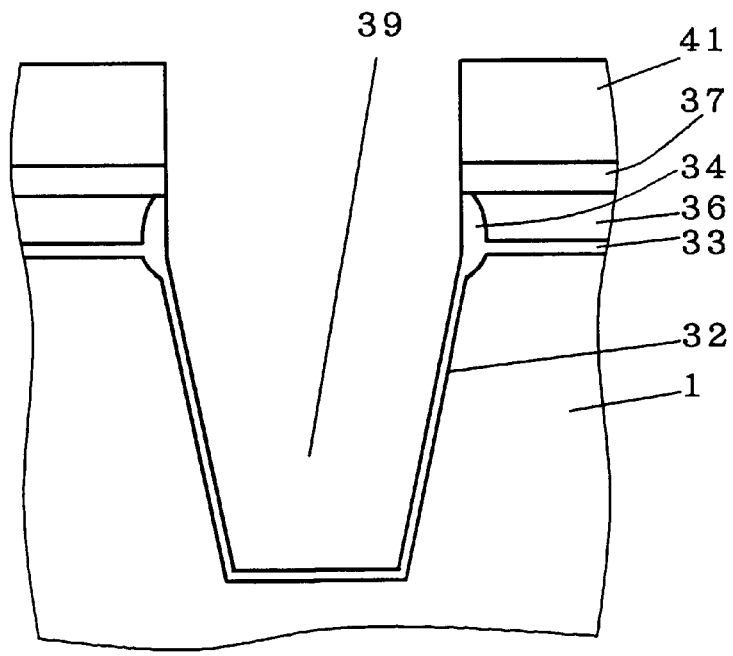

After the resist 42 is removed, a silicon oxide film 32 and silicon oxide 34 are formed by thermal oxidation (see FIG. 7). This process is the same as the steps shown in FIGS. 2 and 3.

Then, heat treatment is carried out at a high temperature of 800 to 850° C. so that the BPSG film 41 causes reflow. Consequently, an opening of the trench 39 shown in FIG. 7 is sealed by the BPSG film 41. Thus, a cavity 43 is formed (see FIG. 8).

By CMP using the nitride film 37 as a stopper, an upper portion 41A of the BPSG film 41 is removed. Consequently, a BPSG 44 is formed to seal the opening of the trench 39 shown in FIG. 7 (see FIG. 9). After the CMP, the nitride film 37 is removed (see FIG. 10). The polysilicon film 36 is removed so that the silicon oxide 34 appears, on a surface, as a sidewall of an STI 2 (see FIG. 11).

Figure 8:
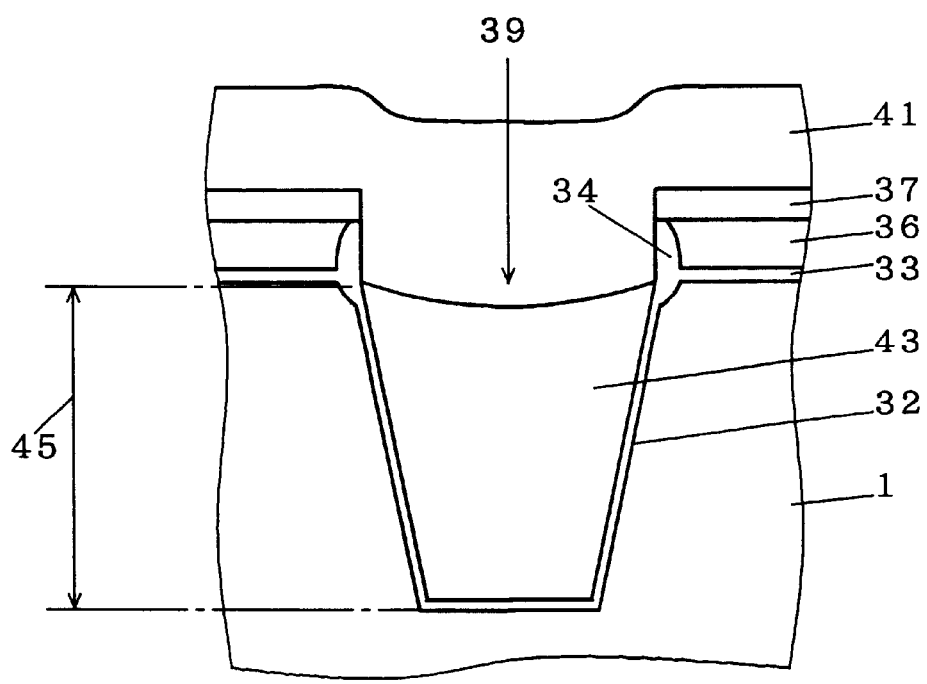
Figure 9:
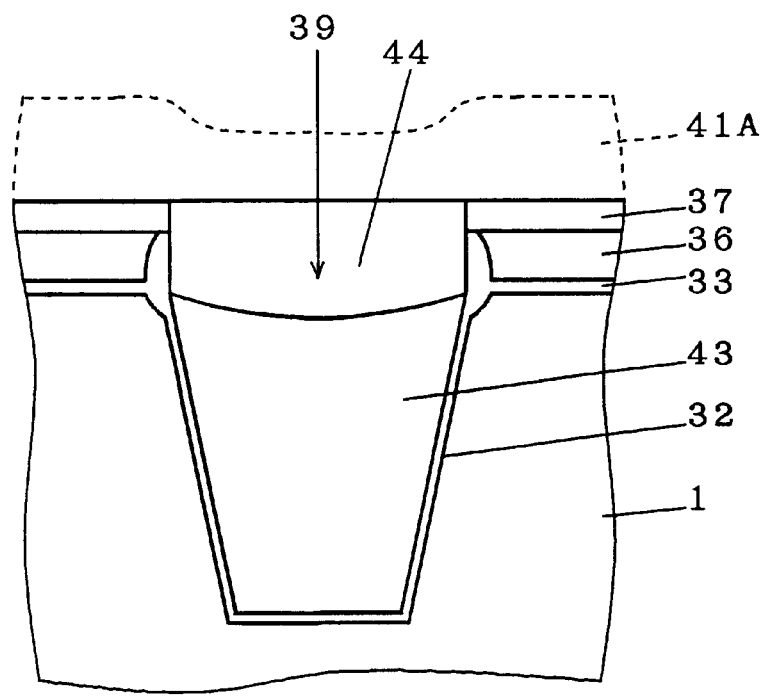
Figure 10:
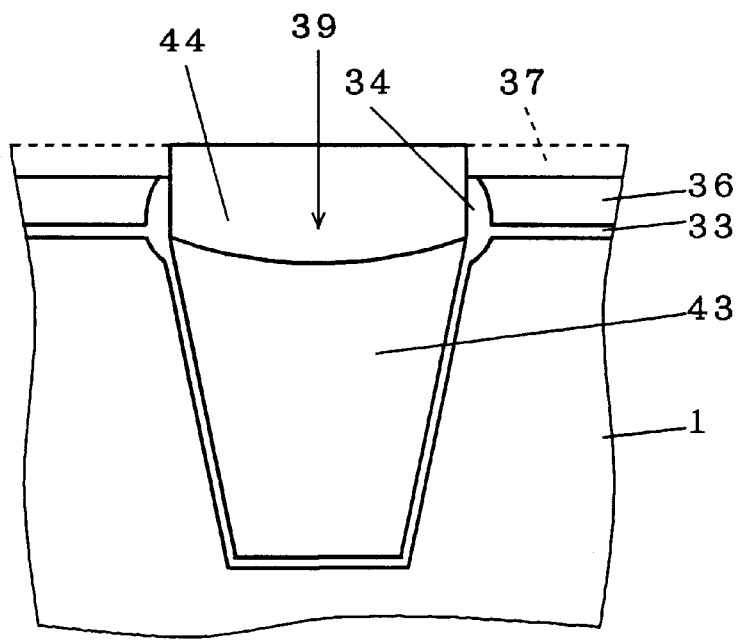
Figure 11:
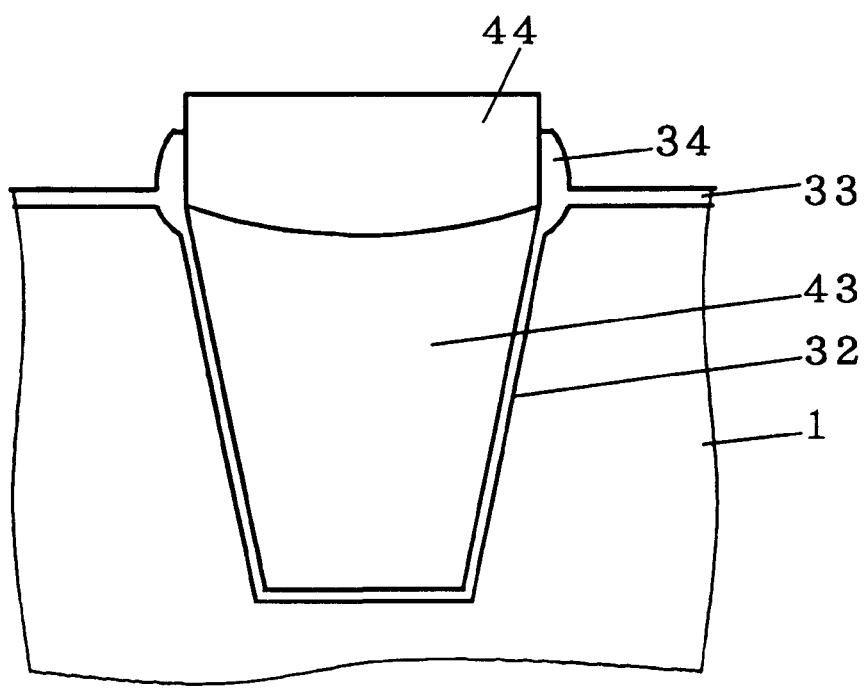

In order to form a cavity 43 at the step shown in FIG. 8, a temperature and a time for the reflow of the BPSG film 41 are set in such a manner that a height from a bottom of the trench 39 which is shown by an arrow 45 can be kept to some extent, for example, a height of about 0.1 to 0.2 μm can be kept. A greater height is better. If a depth of the trench 39 is increased, a width thereof is reduced. The BPSG 44 which has been subjected to the reflow does not fall into the trench 39. However, even if the trench 39 is not tapered, the trench 39 can be closed by the reflow of the BPSG film 41.

The above-mentioned manufacturing method comprises the step of forming the void 43 by the reflow of a reflow glass (the BPSG film 41). Therefore, a process of forming the semiconductor integrated circuit can be simplified.

In the second embodiment, the BPSG has been taken as an example of the reflow glass because it is preferable that the BPSG should be used for overhang. For example, BPTEOS can also be used as the reflow glass.

A peripheral portion of the silicon oxide 34 also swells toward the inside of the trench 39. Therefore, the BPSG 44 with which the trench 39 is closed can be fixed.

Third Embodiment

Figure 12:
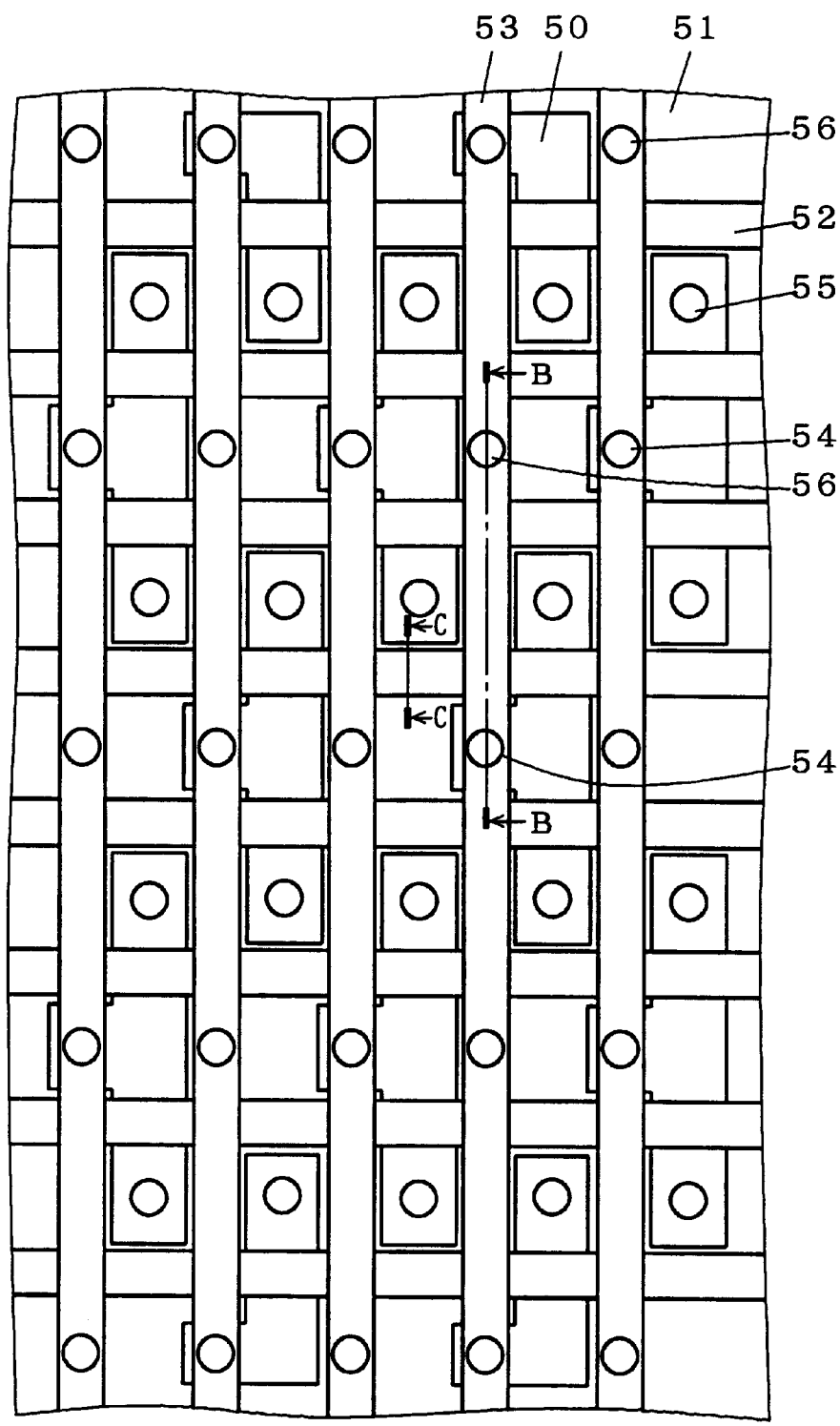
FIG. 12 is a typical view showing an example of a planar structure of a semiconductor integrated circuit according to a third embodiment.
Figure 13:
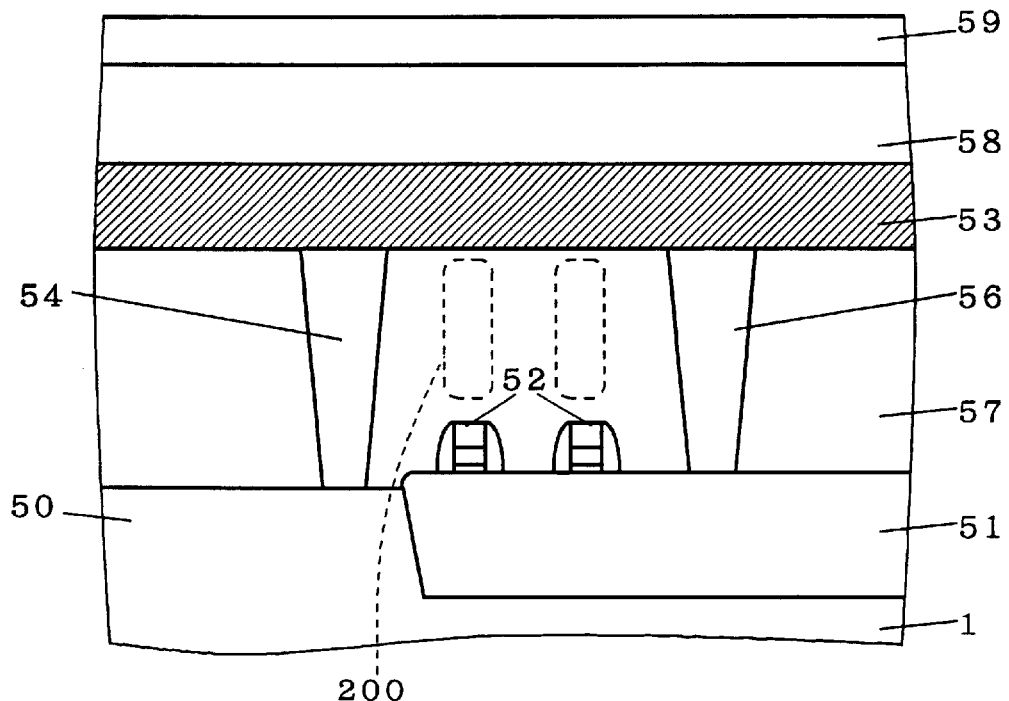
FIG. 13 is a typical view showing a section taken along the line B—B in FIG. 12.
Figure 14:
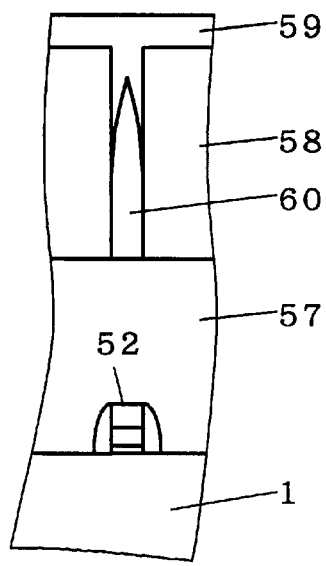
FIG. 14 is a typical view showing a section taken along the line C—C in FIG. 12.

A semiconductor integrated circuit according to a third embodiment which will be described below is characterized in that a cavity is formed under a wire. FIG. 12 is a layout ,showing, a planar structure of the semiconductor integrated circuit according to the third embodiment of the present invention. FIG. 13 shows a section taken along the line B—B in FIG. 12, and FIG. 14 shows a section taken along the line C—C in FIG. 12.

In FIG. 12, a plurality of active semiconductor regions 50 are isolated from each other by an isolation region 51. The active semiconductor region 50 forms a MOS transistor together with a word line 52 provided thereon. A bit line 53 provided orthogonally to the word line 52 on a plane shown in FIG. 12 is connected to a source/drain region of the MOS transistor in the active semiconductor region 50. The bit line 53 is connected to the active semiconductor region 50 through a bit line contact 54. The active semiconductor region 50 is electrically connected, through a storage contact 55, to a storage capacitor which is not shown. The bit line 53 is connected to another wiring through a contact 56. The word line 52 and the bit line 53 have widths of about 0.2 $\mu$m.

As shown in FIG. 13, a cavity 57 is provided between a semiconductor substrate 1 and the bit line 53. A height of the cavity 57, that is, a space between a principal plane of the semiconductor substrate 1 and the bit line 53 is about 0.5 $\mu$m. The bit line 53 having a thickness of about 0.2 $\mu$m is fixed to the semiconductor substrate 1 by the bit line contact 54 and the contact 56. The contacts 54 and 56 have diameters of about 0.2 to 1.5 $\mu$m. An interlayer oxide film 58 having a thickness of about 0.3 $\mu$m is formed on the bit line 53. A BPSG film 59 is formed for flattening(on the interlayer oxide film 58. The BPSG film 59 has a thickness of about 0.1 $\mu$m. For simplicity, the interlayer oxide film 58 and the BPSG film 59 are omitted in FIG. 12.

The contacts 54 and 56 and the semiconductor substrate 1 are coupled by covalent bond formed between atoms constituting them. Accordingly, bond strength can be enhanced by increasing cleanliness of a surface of the semiconductor substrate 1.

Figure 15:
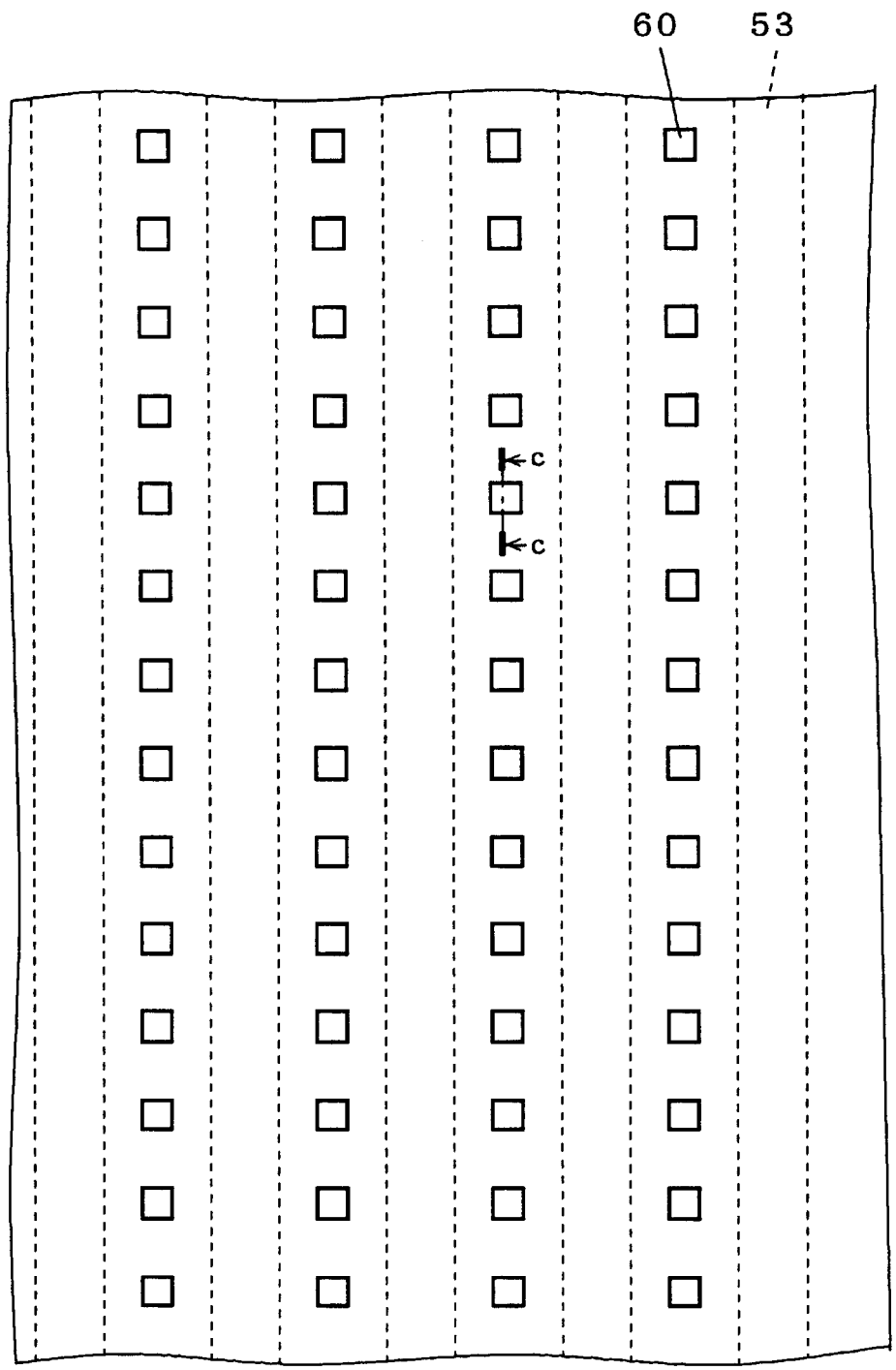
FIG. 15 is a typical view showing a top face of the semiconductor integrated circuit according to the third embodiment.

As shown in FIG. 14, a trench 60 is formed in the interlayer oxide film 58. FIG. 14 shows a state in which an upper portion of the trench 60 is sealed by the BPSG film 59. FIG. 15 shows a top face of the semiconductor integrated circuit obtained before the BPSG film 59 shown in FIG. 14 is formed. The cavity 57 shown in FIG. 14 communicates with the outside through the trench 60 before it is covered with the BPSG film 59. While the trench 60 is provided to form the cavity 57 as will be described below, it is flattened by the BPSG film 59 so that a wiring layer or the like can further be formed thereon.

Thus, the cavity 57 is provided. Consequently, a layer space 200 which is formed between the word line 52 and the bit line 53 at a predetermined distance from the semiconductor substrate 1 as shown in FIG. 13 is filled with only air. The space 200 contributes to insulation of the word line 52 from the lit line 53. The contacts 54 and 56 are not provided in the vicinity of the space 200. A capacitance between the word line 52 and the bit line 53 becomes a problem. However, the capacitance between the word line 52 and the bit line 53 is reduced more than in the prior art. Accordingly, an operating speed of the semiconductor integrated circuit can be enhanced. A capacitance between the bit lines 53 can also be reduced by the trench 60.

Figure 16:
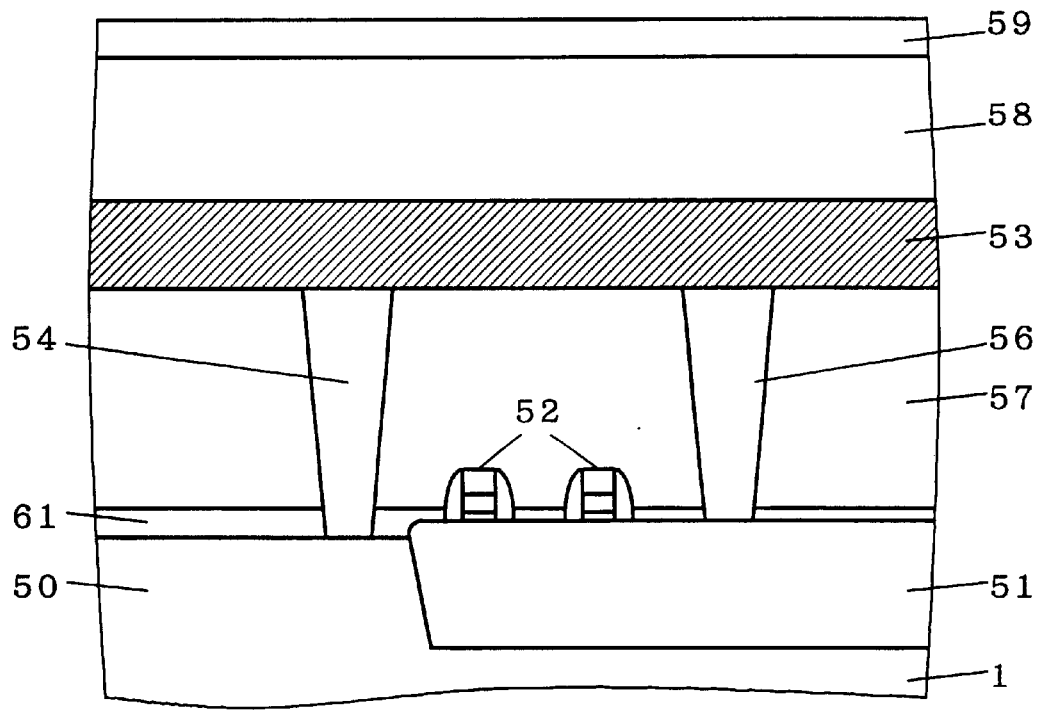
FIGS. 16 to 18 are typical views showing steps of manufacturing the semiconductor integrated circuit according to the third embodiment.

While only the cavity 57 exists between the semiconductor substrate 1 and the bit line 53 in the description of the third embodiment, an insulation film 61 may be formed on the semiconductor substrate 1 as shown in FIG. 16. Also in this case, the same effects as in the third embodiment can be obtained. The insulation film 61 has an auxiliary function of fixing the contacts 54 and 56 to the semiconductor substrate 1. Furthermore, the insulation film 61 can prevent the semiconductor substrate 1 from being contaminated by a material forming the bit line 53.

Figure 17:
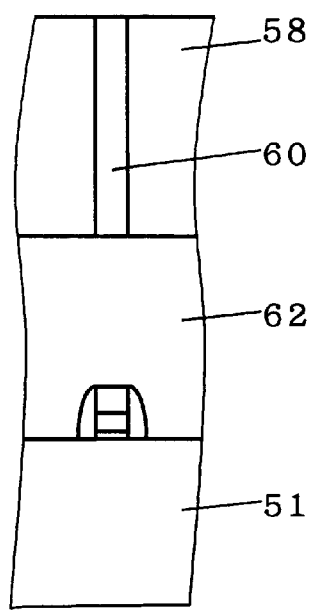
Figure 18:
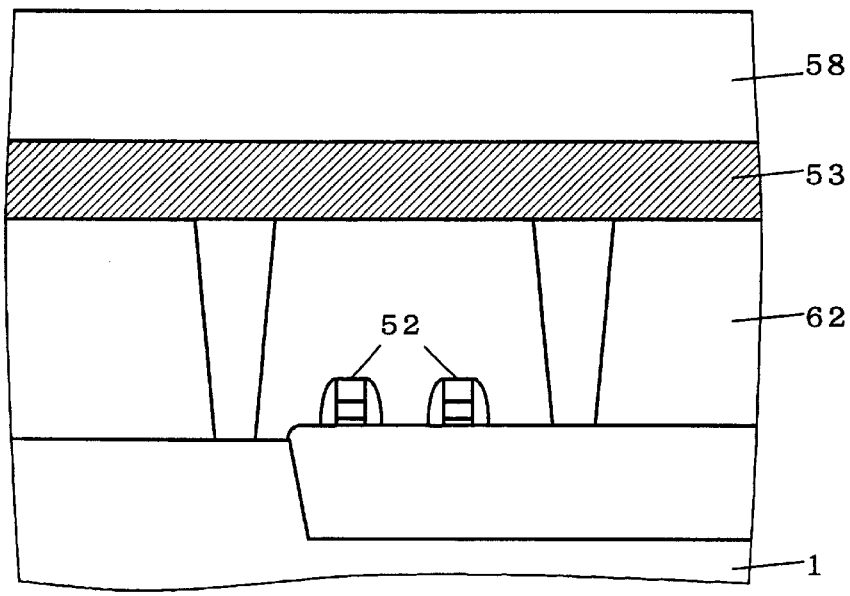

A method for forming the cavity 57 shown in FIGS. 13 and 14 will be described below with reference to FIGS. 17 and 18. A layer of a water-soluble glass 62 is provided in a portion where the cavity 57 is to be formed as is shown in FIGS. 17 and 18. If the semiconductor integrated circuit soaks in water, the water-soluble glass 62 melts from the trench 60 shown in FIG. 17. When the water-soluble glass 62 provided under the interlayer oxide film 58 is completely removed, the cavity 57 is formed in a portion where the water-soluble glass 62 was provided. The water-soluble glass 62 shown in FIG. 18 connects with the water-soluble glass 62 shown in FIG. 17. Therefore, the water-soluble glass 62 shown in FIG. 18 is also removed through the trench 60.

A manufacturing process for obtaining a structure shown in FIG. 18 will be described below. After the word line 52 is formed, the water-soluble glass 62 is deposited and flattened by CMP. A mask formed on the water-soluble glass 62 is subjected to patterning. Then, the water-soluble glass 62 is partially removed by anisotropic etching and a hole for forming a contact node is provided. Thereafter, doped polysilicon is deposited and is buried in the hole, for example. The doped polysilicon is flattened by the CMP using the remaining water-soluble glass 62 as a stopper. Subsequently, metal such as tungsten (W) or titanium (Ti) is deposited to form a metal film. A mask is formed on the metal film and is subjected to patterning. By etching, the metal wire 53 is formed. Finally, the interlayer oxide film 58 is provided. Thus, the structure shown in FIG. 18 is finished.

Examples of the water-soluble glass include a BSG (Boron Silicate Glass) doped with $B_2O_3$. A film of the water-soluble glass 62 is formed by causing a mixed gas of $SiH_4$ and $O_2$ to flow and by thermally decomposing $BO_3$ $(C_2H_5O)_3$ (triethoxy borate) or $BO_2(CH_3O)_3$ (trimethoxy borate) at a temperature of about 400 to 500° C. in the atmosphere, for example.

Fourth Embodiment

While the cavity 57 has been provided between the semiconductor substrate 1 and the bit line 53 in the semiconductor integrated circuit according to the third embodiment, a cavity may be provided between the bit line 53 and wires formed thereon.

Figure 19:
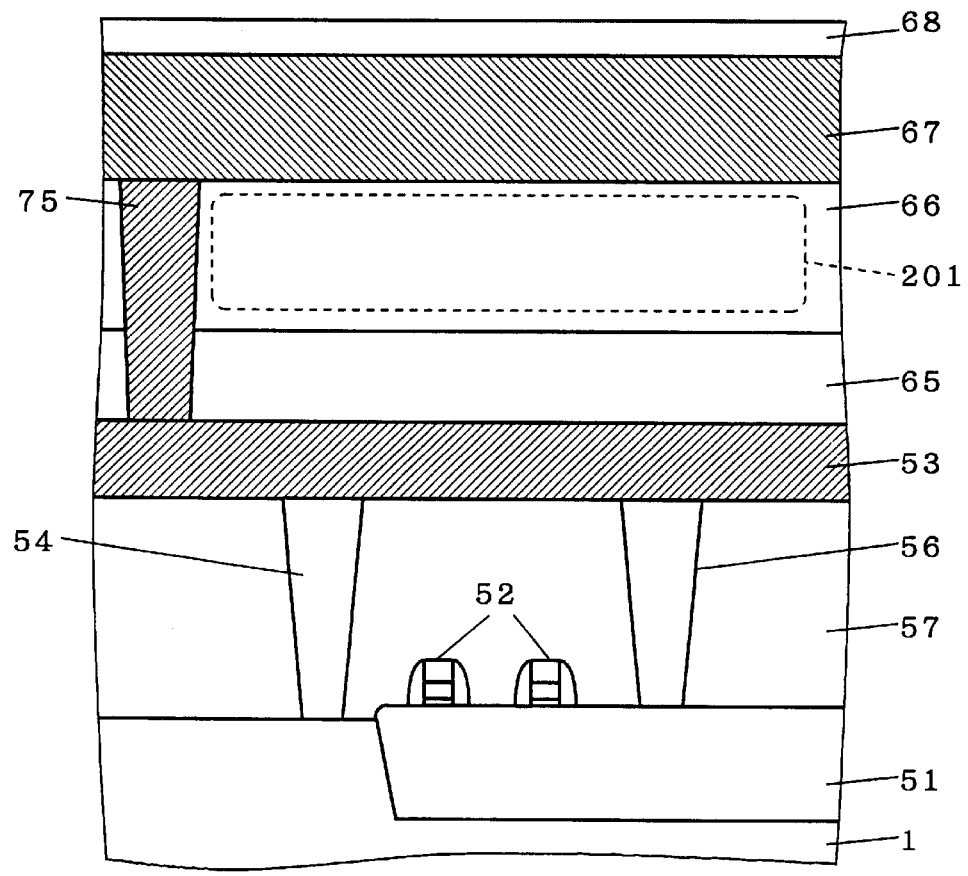
FIG. 19 is a typical view showing an example of a sectional structure of a semiconductor integrated circuit according to a fourth embodiment.

FIG. 19 is a typical view showing a sectional structure of a semiconductor integrated circuit having the abovementioned structure according to a fourth embodiment. In FIG. 19, the same reference numerals as those in FIG. 13 denote the same portions as those in FIG. 13. As shown in FIG. 19, an oxide film 65 halving, a thickness of about 0.2 $\mu$m is formed on a hit line 53. A cavity 66 having a height of about 0.3 $\mu$m is formed on the oxide film 65. A metal wire 67 is formed over the oxide film 65 with the cavity 66 interposed therebetween. The metal wire 67 has a thickness of about 0.2 μm. An oxide film 68 having a thickness of about 0.05 μm is formed on the metal wire 67.

The cavity 66 is provided between the bit line 53 and the metal wire 67. Therefore, a wiring capacitance is reduced by a layer space 201 which is formed between the bit line 53 and the metal wire 67 at a predetermined distance from a semiconductor substrate 1. Consequently, the same effects as in the third embodiment can be obtained. The metal wire 67 is supported by a tungsten plug 75 which is electrically connected to the bit line 53. While a single tungsten plug 75 is shown in FIG. 19, a large number of tungsten plugs are provided in portions which are not shown. Therefore, mechanical stability can be obtained and the metal wire 67 is supported by the tungsten plug 75.

The cavity 66 is formed by the same method as the method for forming the cavity 57 in the semiconductor integrated circuit according to the third embodiment.

Fifth Embodiment

Figure 20:
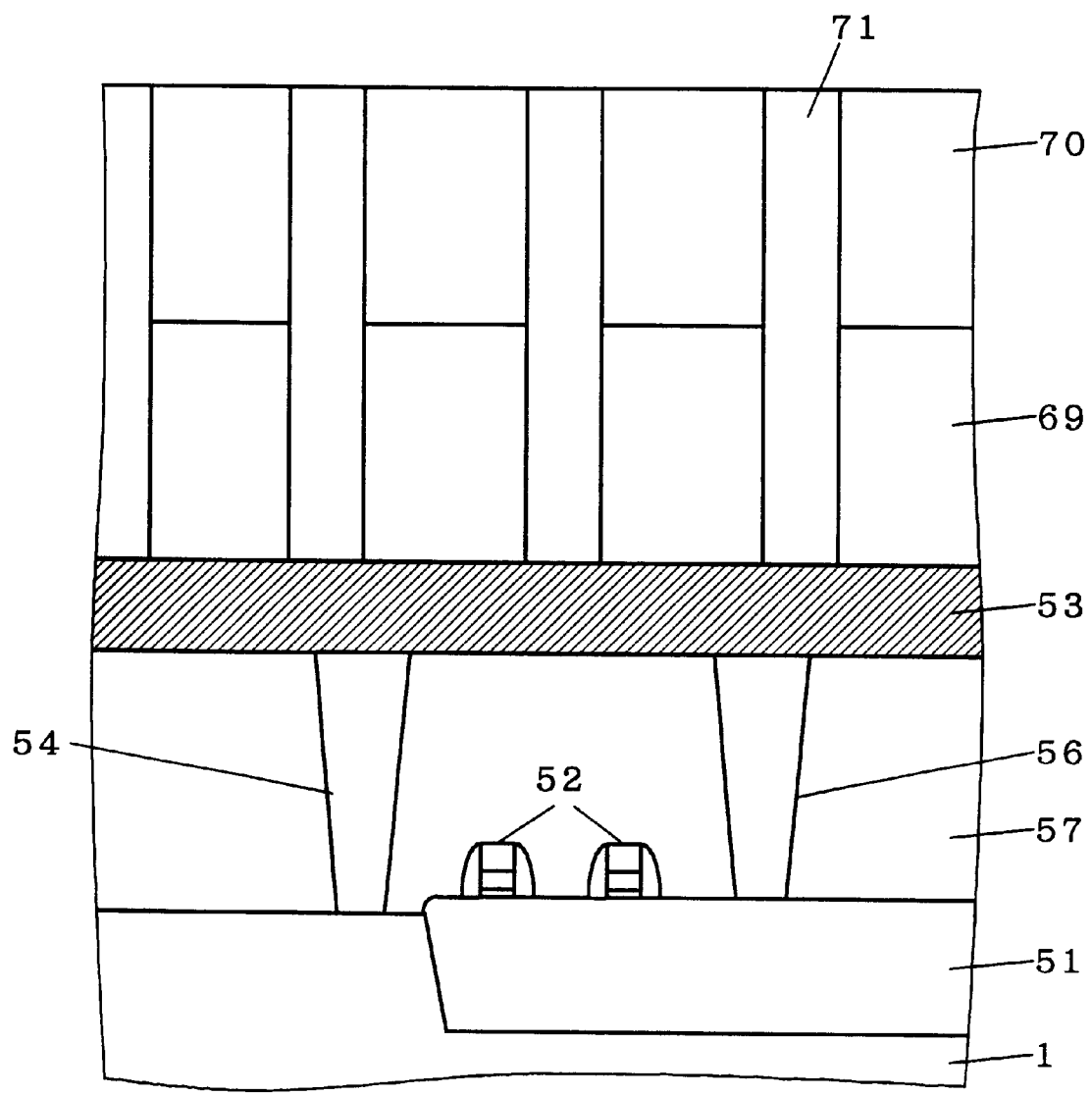
FIGS. 20 to 22 are typical views showing steps of manufacturing a semiconductor integrated circuit according to a fifth embodiment.
Figure 21:
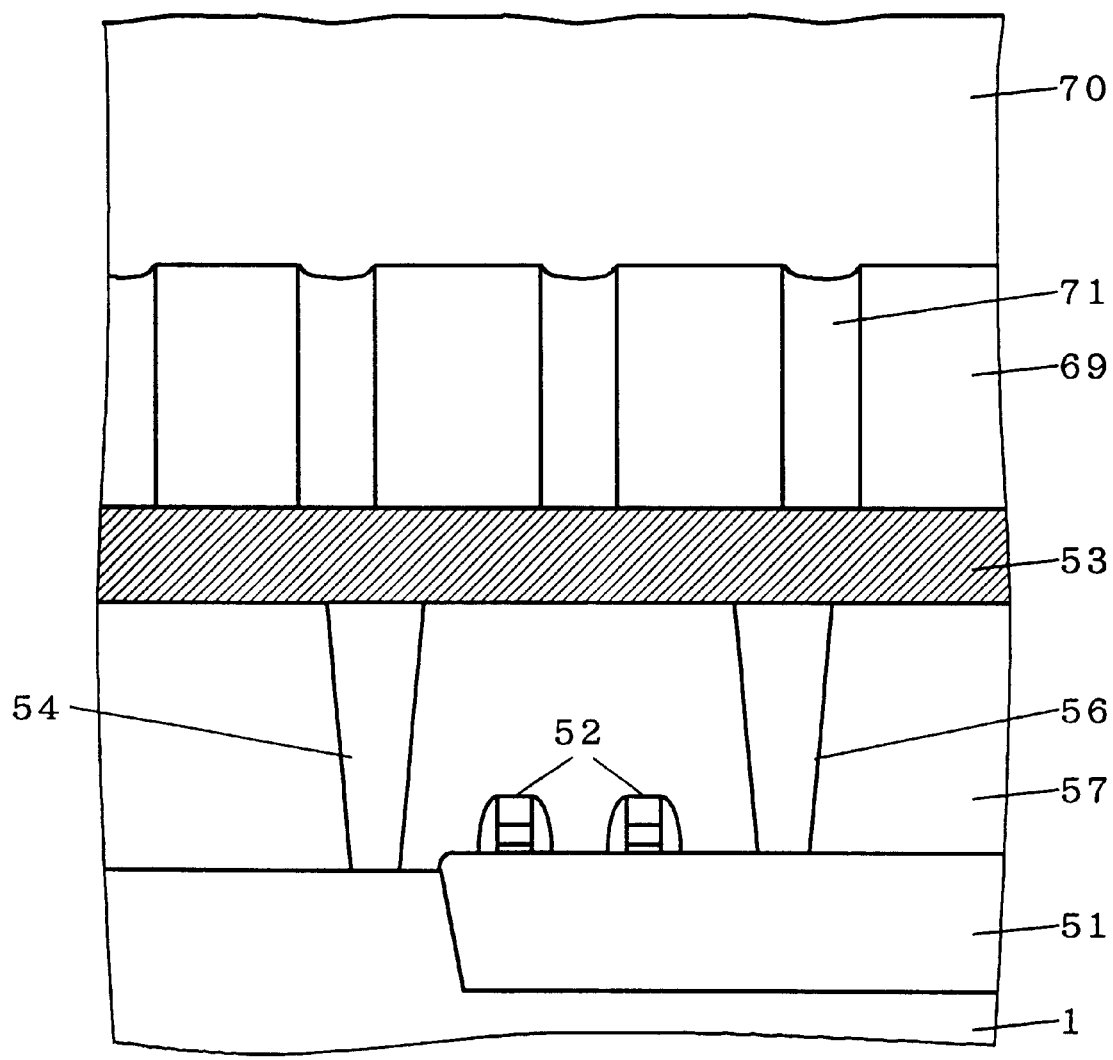
Figure 22:
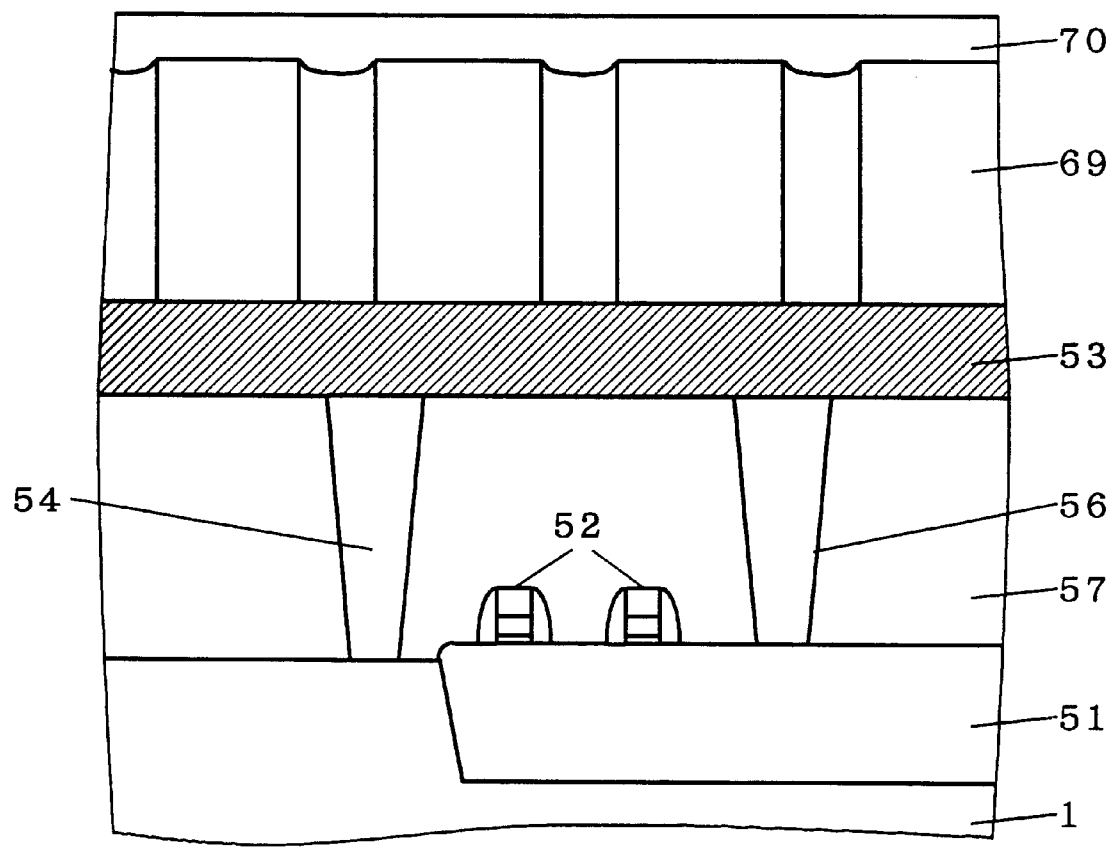

While the case where all are changed into a cavity has been described in the fourth embodiment, it is apparent that small effects can be obtained if a part of the interlayer oxide film provided between the wiring layers is changed into the cavity. A method for manufacturing a semiconductor integrated circuit according to a fifth embodiment can simply he performed to form a cavity in a part of an interlayer oxide film FIGS. 20 to 22 are typical views showing a manufacturing method for changing, a part of all interlayer oxide film provided between wiring layers into a cavity. In FIGS. 20 to 22, the same reference numerals as those in FIG. 19 denote the same portions as those in FIG. 19. As shown in FIG. 20, an interlayer oxide film 69 having a thickness of about 0.5 μm is formed on a bit line 53, and a BPSG film 70 having a thickness of about 0.5 μm is formed on the interlayer oxide film 69. A trench 71 having a planer shape of about 0.15 μm per square is formed in the interlayer oxide film 69 and the BPSG film 70.

Figure 23:
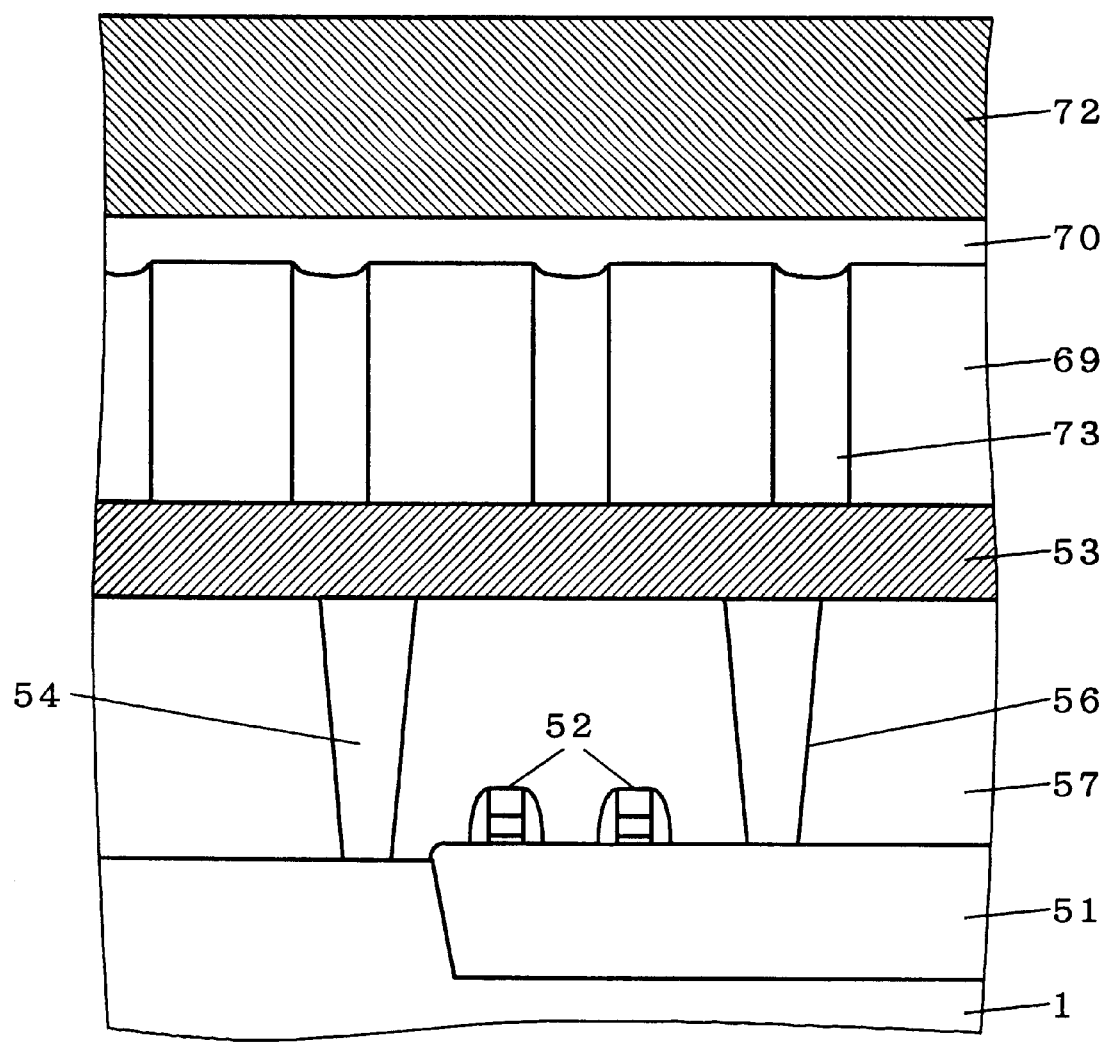
FIG. 23 is a typical view showing another example of a sectional structure of the semiconductor integrated circuit according to the fifth embodiment.

As shown in FIG. 21, the BPSG film 70 is subjected to reflow so that the trench 71 formed in the BPSG film 70 is sealed At this time, the condition that the BPSG does not enter the trench 71 of the interlayer oxide film 69 if possible, for example, the condition described in the second embodiment is set. Then, the BPSG film 70 having an irregular surface generated by the reflow is flattened (FIG. 22). As shown in FIG. 23, a metal wire 72 is provided. By the above-mentioned process, a cavity 73 for reducing a capacity between the metal wire 72 and the bit line 53 can simply be formed.

Sixth Embodiment

Figure 24:
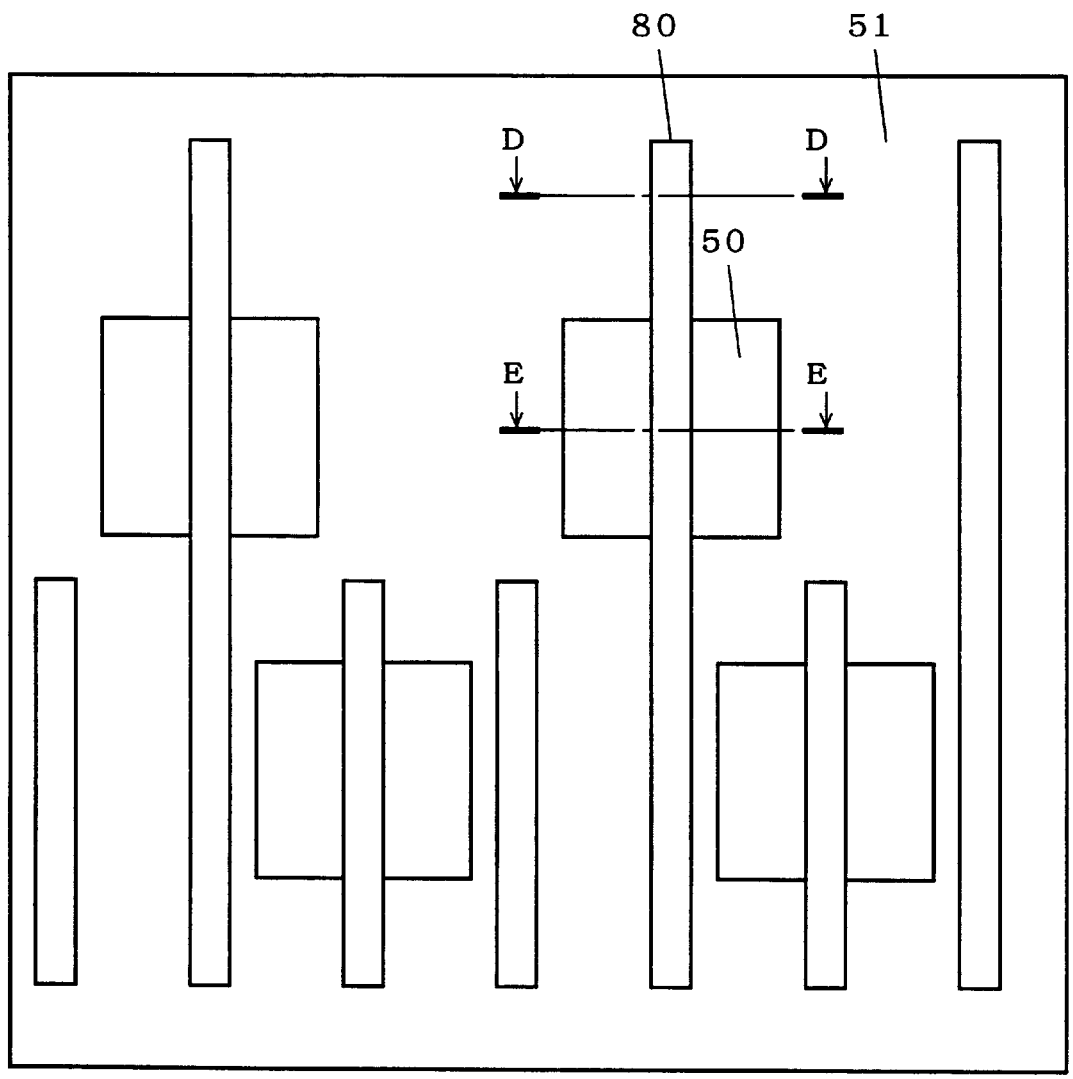
FIG. 24 is a typical view showing an example of a planar structure of a semiconductor integrated circuit according to a sixth embodiment.
Figure 25:
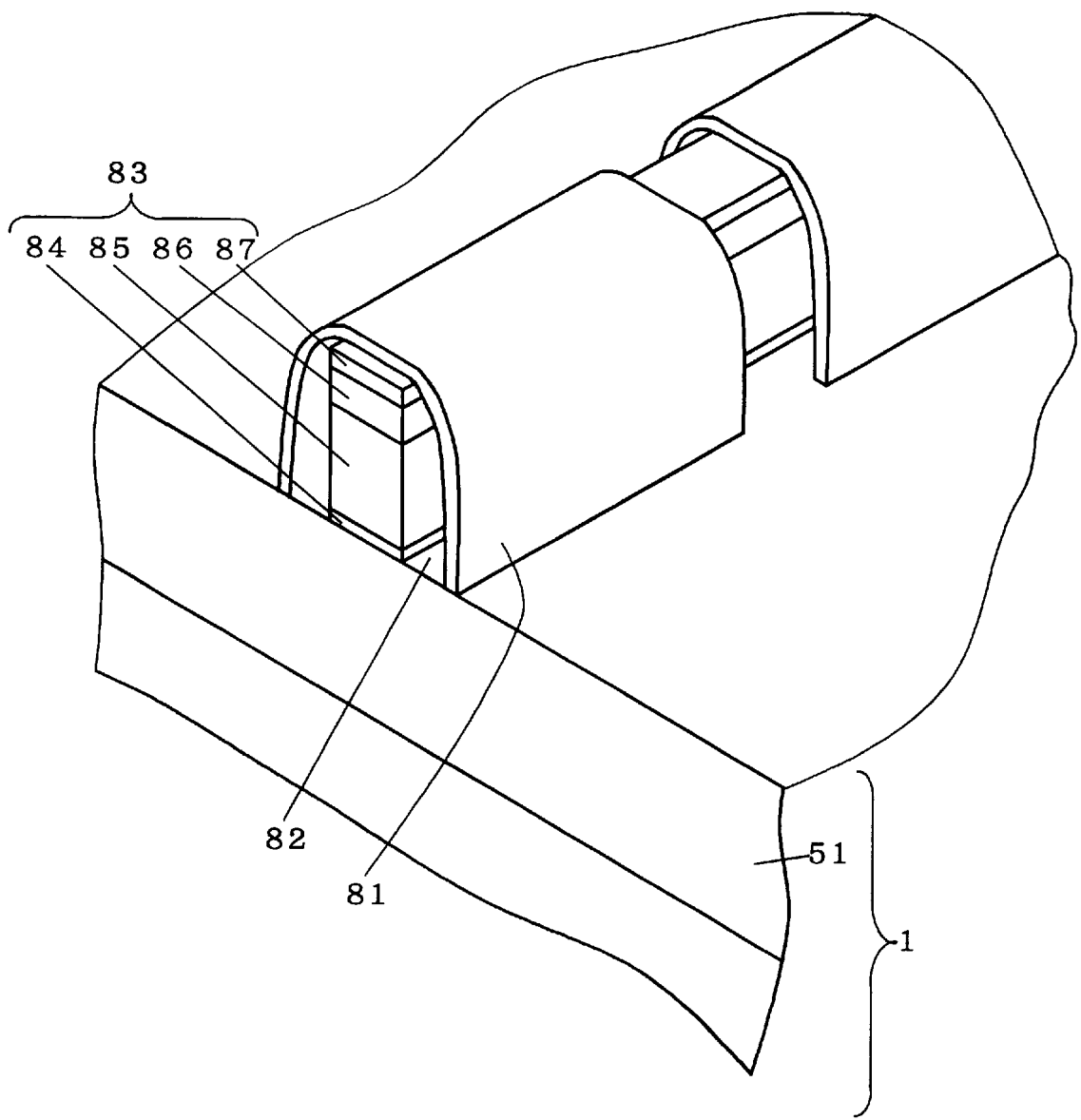
FIG. 25 is a partially sectional perspective view showing an example of a structure of the semiconductor integrated circuit according to the sixth embodiment.
Figure 26:
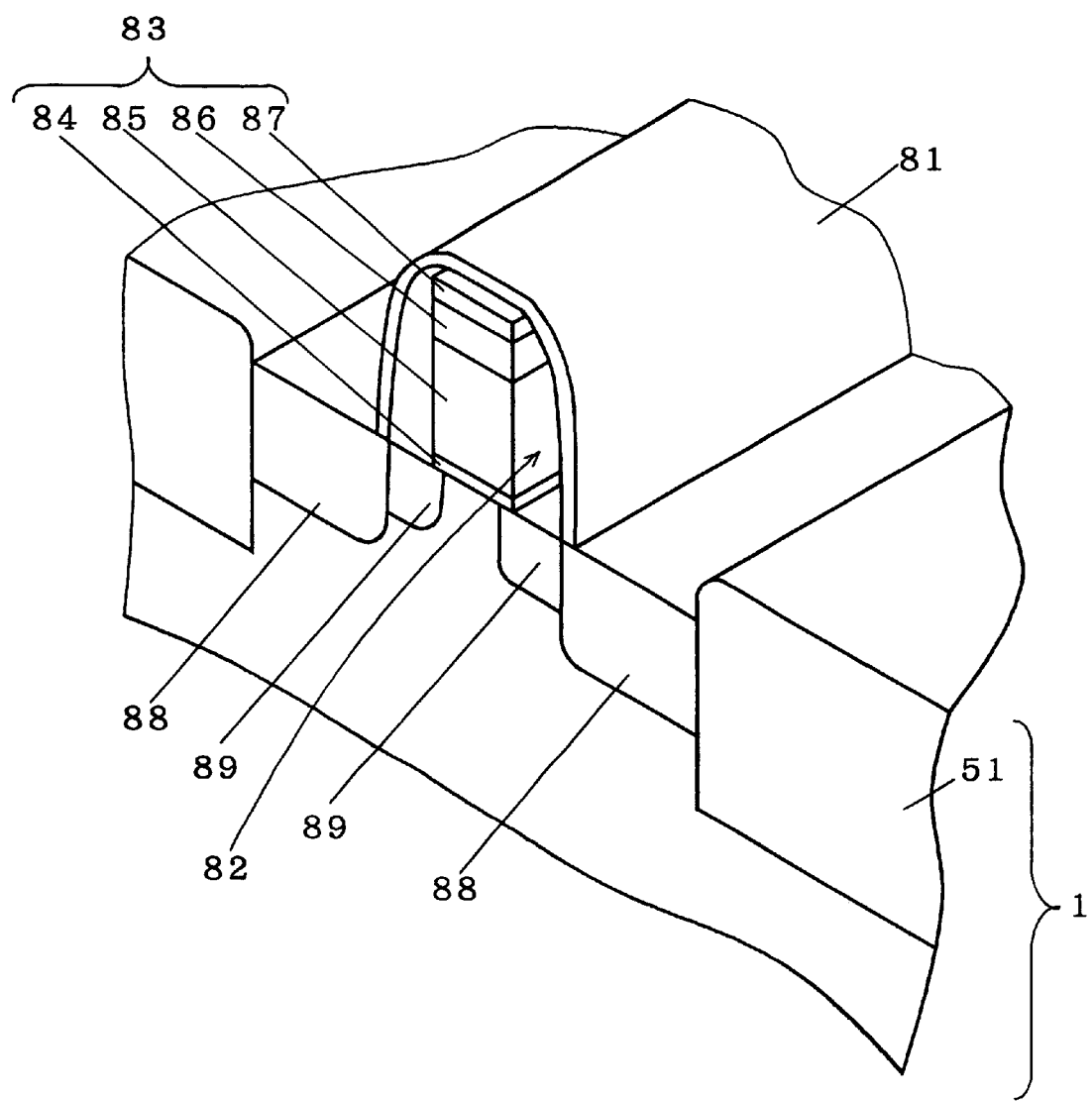
FIG. 26 is a partially sectional perspective view showing an example of the structure of the semiconductor integrated circuit according to the sixth embodiment.

FIG. 24 is a layout showing a planar structure of a semiconductor device according to a sixth embodiment FIG. 25 is a perspective view in which a section of a word line 80) taken along the line D—D in FIG. 24 is exposed. FIG. 26 is a perspective view in which a section of the word line 80 taken along the line E—E in FIG. 24 is exposed. As shown in FIGS. 25 and 26, a cavity 82 is formed between a sidewall spacer 81 and stacked layers 83. The cavity 82 can prevent stress from being applied directly from the outside to the stacked layers 83. Consequently, it can he expected that the stress can be relaxed in a peripheral portion of the stacked layers 83. If great stress is applied to a gate end (the peripheral portion of the stacked layers 83), defects and an interface state are generated. Therefore, a leak current is increased when a MOS transistor is off. The cavity 82 is formed between a source/drain region 89 having a lower impurity concentration in an LDD structure and a gate electrode 85. For this reason, a source-to-gate capacitance and a drain-to-gate capacitance are reduced. By a reduction in these capacities, an operating speed of the MOS transistor can be enhanced.

As described above, the cavity 82 is formed between the sidewall spacer 81 and the stacked layers 83 so that characteristics of the MOS transistor can be enhanced. The sidewall spacer 81 has a small thickness. Therefore, it is hard to make a difference between impurity concentrations of source/drain regions 88 and 89 formed in self-alignment.

In a manufacturing method for easily producing the LDD structure while forming the cavity 82, a step of forming the cavity 82 will be described below with reference to FIGS. 27 to 29. Next, a state in which a step of easily forming the LDD structure is executed in the manufacturing method will be described below with reference to FIGS. 30 and 31.

Figure 27:
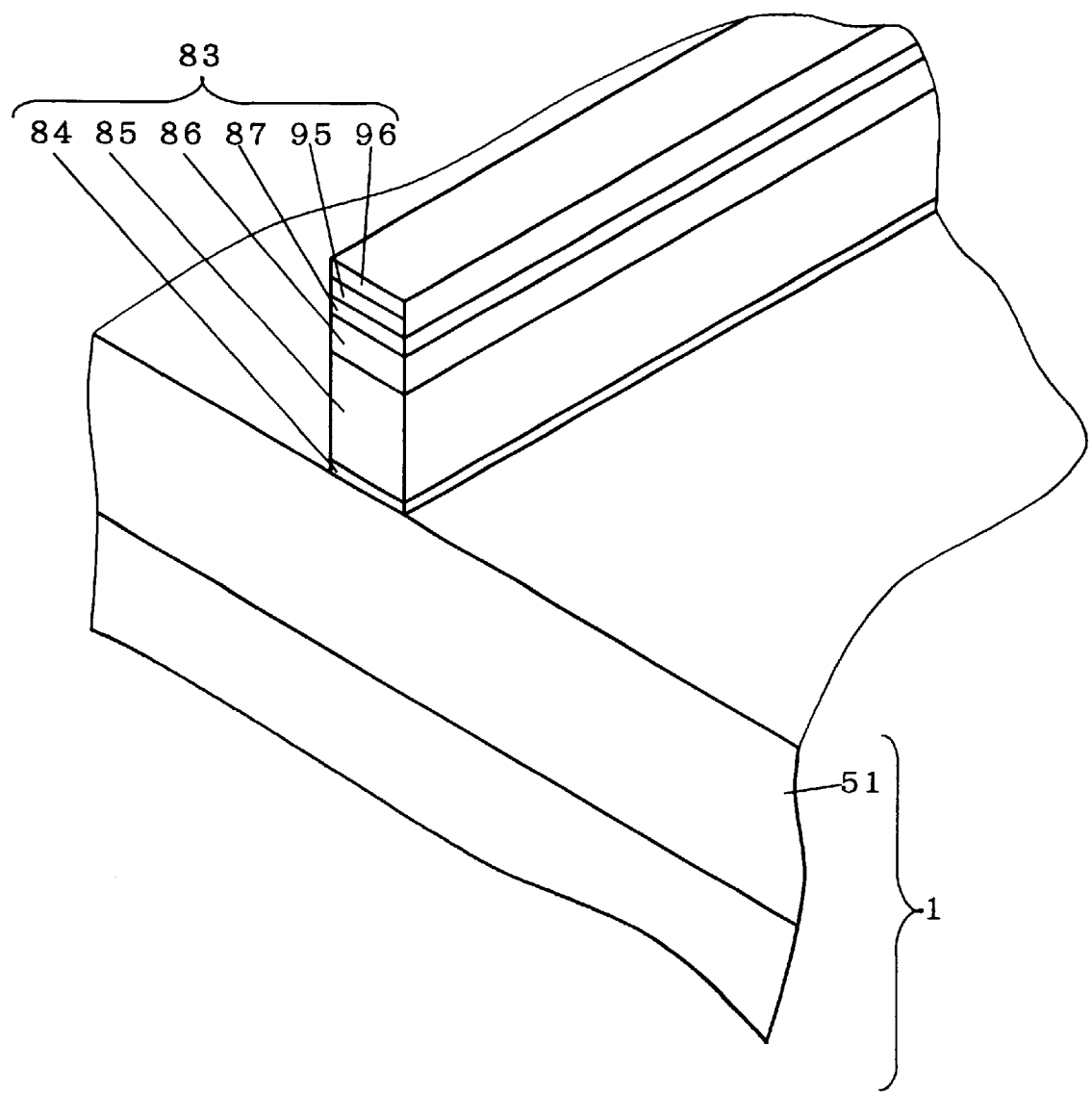
FIGS. 27 to 32 are partially sectional perspective views showing steps of manufacturing the semiconductor integrated circuit according to the sixth embodiment.
Figure 28:
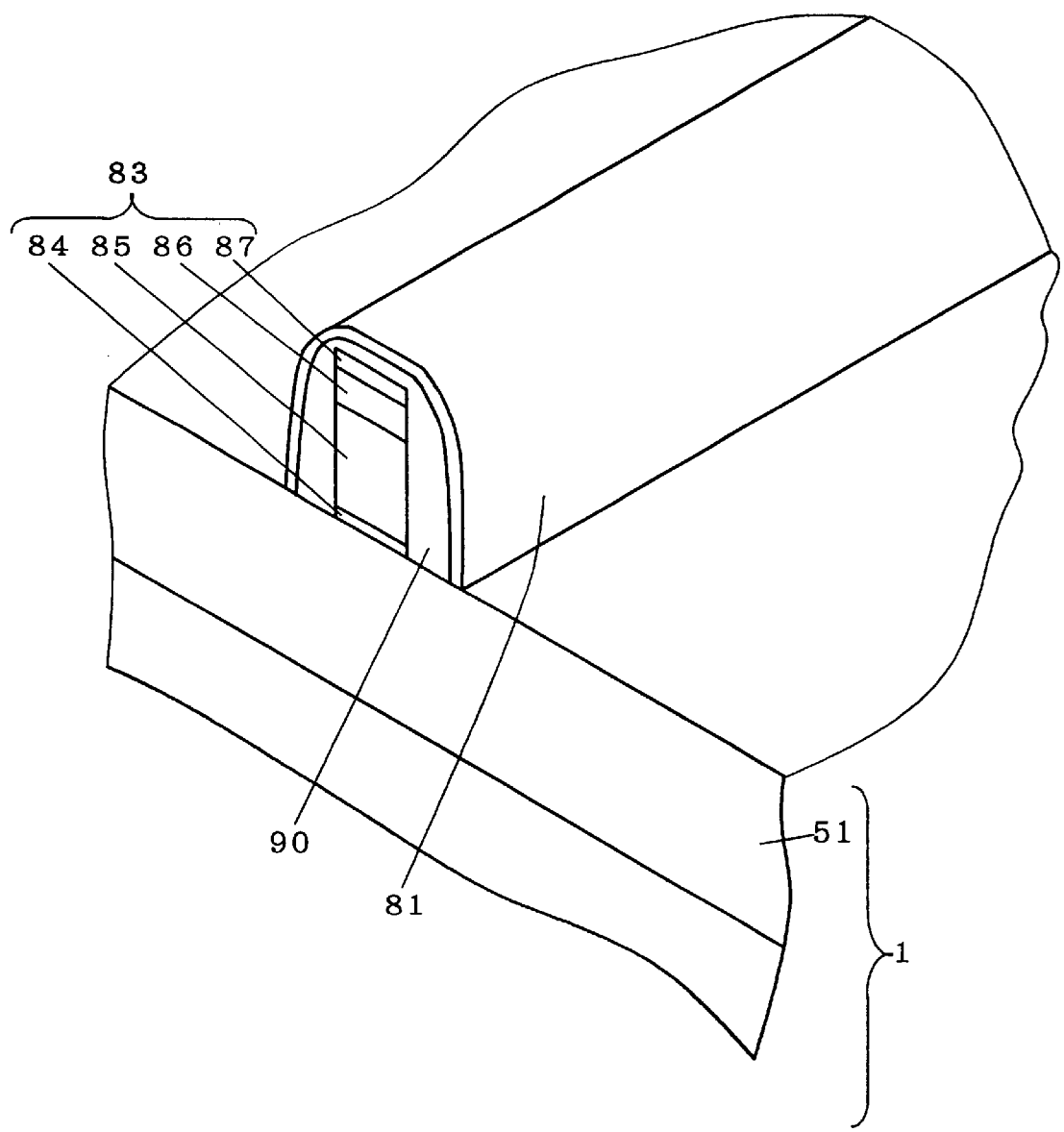

First of all, a gate oxide film 84 having a thickness of about 0.01 μm, a polysilicon gate electrode 85 having a thickness of about 0.1 μm, a tungsten silicide film 86 having a thickness of about 0.03 μm, a TEOS (Tetra Ethyl Ortho Silicate) film 87 having a thickness of about 0.02 μm, a water-soluble glass film 95 having a thickness of about 0.02 μm, and a nitride film 96 having a thickness of about 0.02 μm are provided to form bland-shaped stacked layers 83 on a semiconductor substrate 1 as shown in FIG. 27. The stacked layers 83 have a width of about 0.1 μm. A water-soluble glass is provided in a thickness of about 0.06 μm on the stacked layers 83. By using the nitride film 96 as a mask, the water-soluble glass having a thickness of about 0.07 μm is removed b anisotropic etching by means of a reactive ion etching device. Thus, a spacer 90 made of the water-soluble glass is formed as a first sidewall spacer.

A nitride film is provided on the spacer 90 by using a low pressure CVD device for causing $SiH_2Cl_2$ and $NH_3$ gases to react. In this case, a pressure is set to 0.2 to 0.5 Torr and a temperature is set to 600 to 700° C. Then, the nitride film is subjected to anisotropic etching by using the reactive ion etching device. Consequently, a second sidewall spacer 81 is formed to cover the spacer 90 (see FIG. 28).

Figure 29:
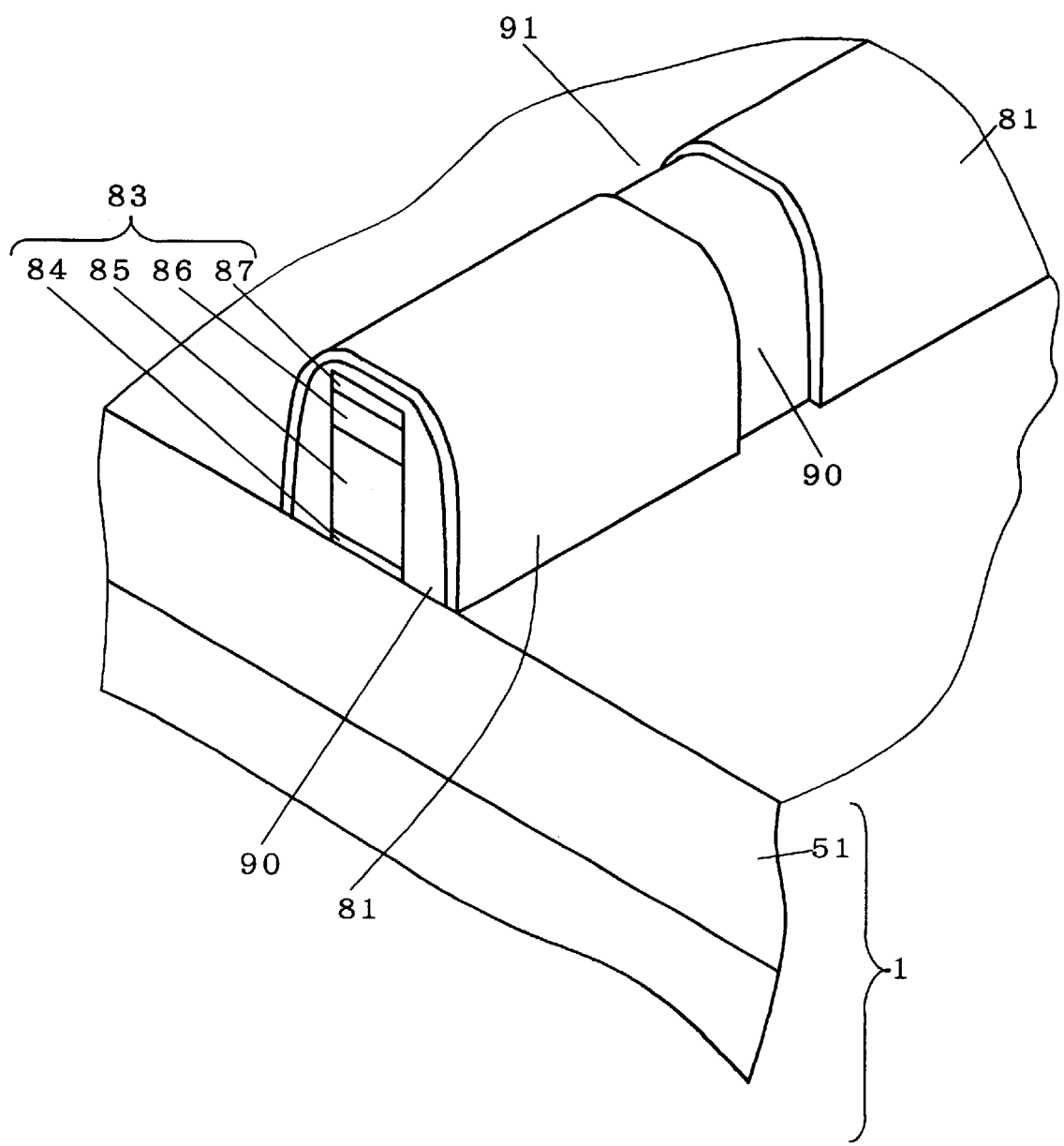

As shown in FIG. 29, a part of the sidewall spacer 81 is removed so that a window 91 having a length of about 0.2 to 1 μm is formed. The sidewall spacer 81 is partially removed by etching using a patterned mask so that the window 91 is formed. If soak in water is carried out in this state, the spacer 90 is dissolved and removed through the window 91. The window 91 is positioned in a portion excluding the active semiconductor region 50 shown in FIG. 24.

Figure 30:
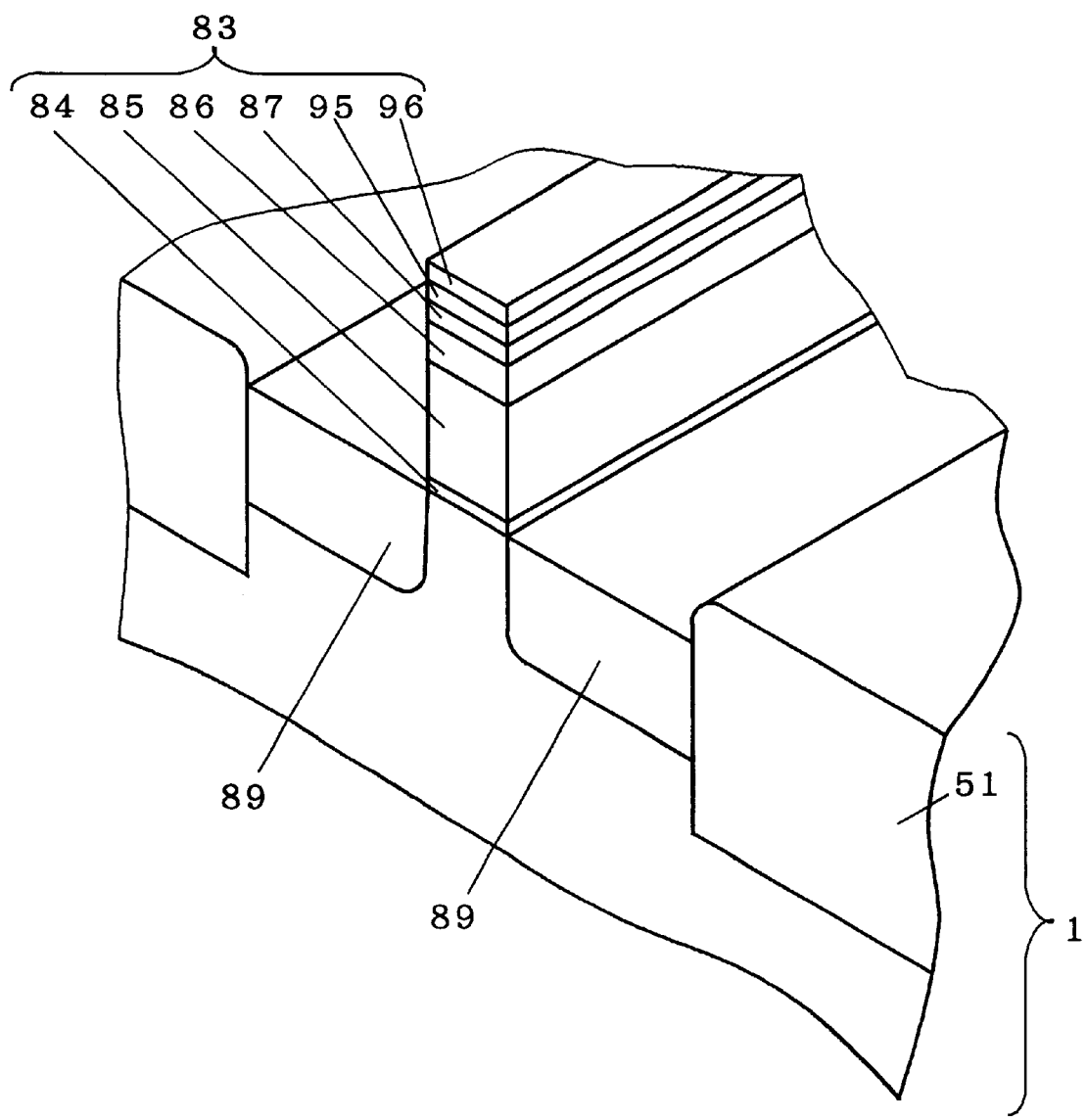

FIG. 30 shows a state in which the source/drain region 89 having a low impurity concentration is formed by using, as a mask, the stacked layers 83 shown in FIG. 27 after the stacked layers 83 is formed.

Figure 31:
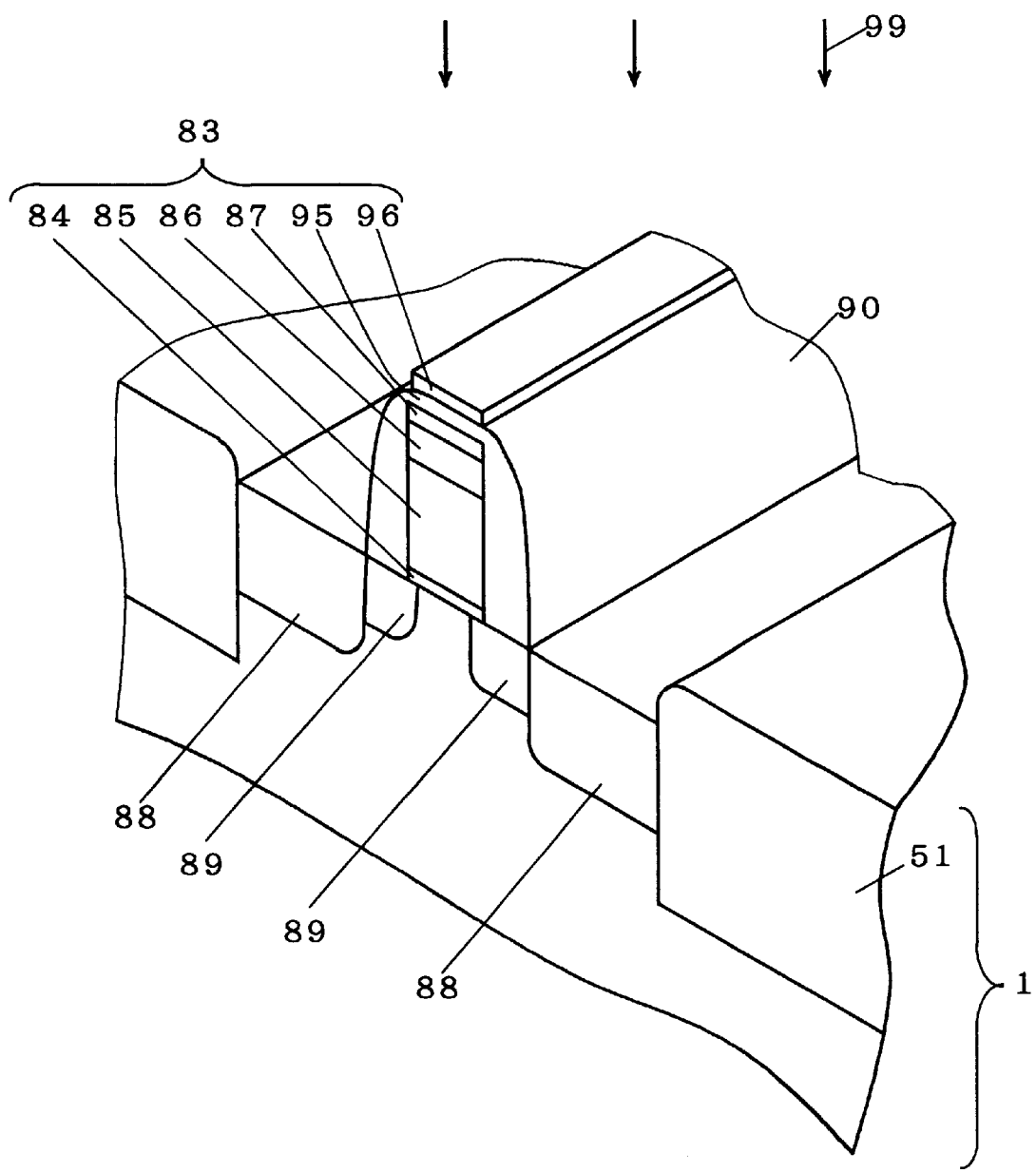
Figure 32:
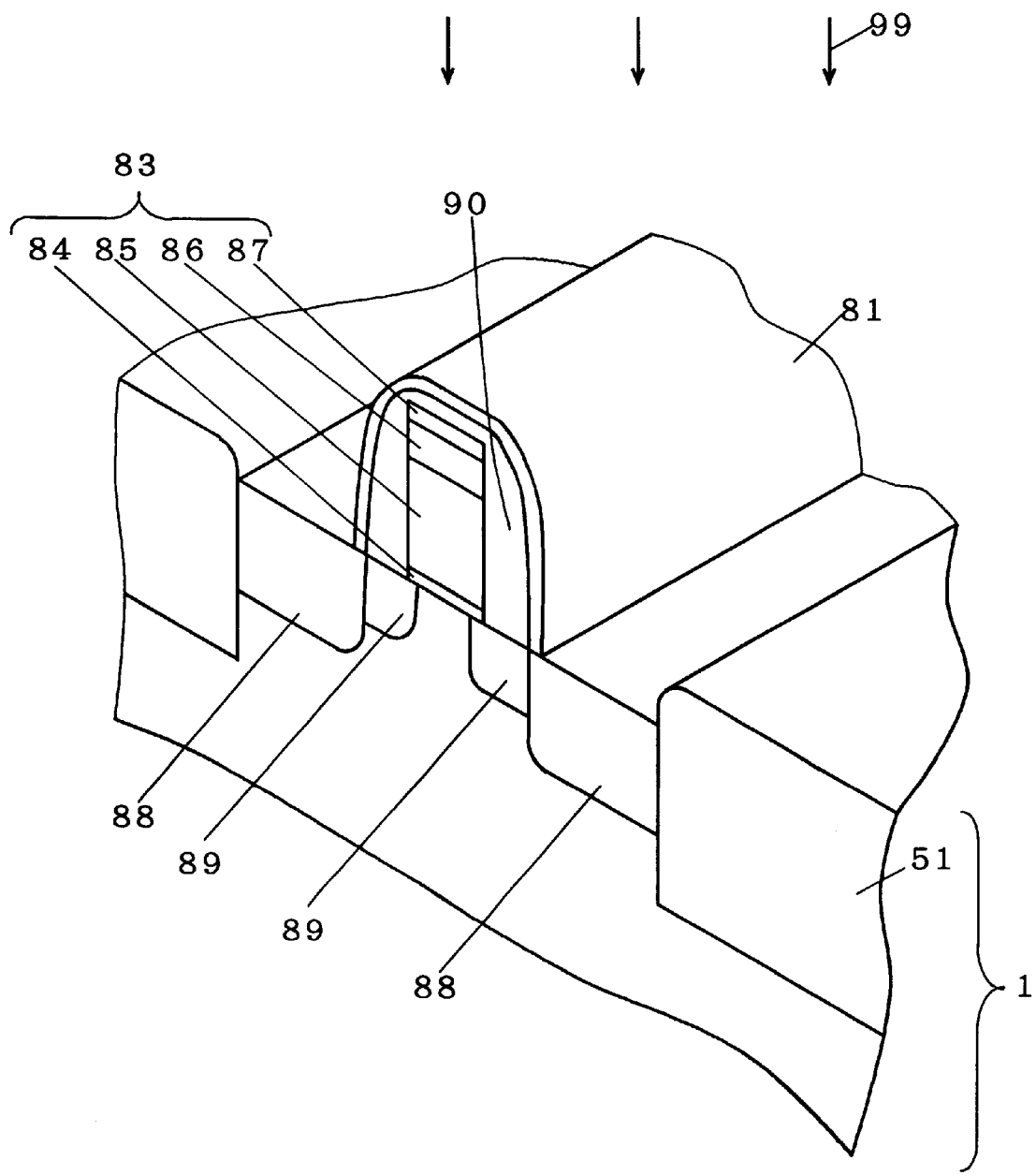

An ion 99 is implanted in a state shown in FIG. 31 or 32, that is, a state in which the spacer 90 is provided or both the spacers 81 and 90 are provided. Consequently, the source/drain region 88 having a high impurity concentration is formed.

In the case where an impurity is implanted in the state in which the spacer 90 is formed and the sidewall spacer 81 shown in FIG. 32 is not formed, that is, in the state shown in FIG. 31, the sidewall spacer 81 can be prevented from being damaged. In the case where the ion 99 is implanted in the state in which both the spacers 81 and 90 are provided (see FIG. 32), the sidewall spacer 81 is damaged by the ion implantation and an interface state is generated in a portion where the sidewall spacer 81 is in contact with the semiconductor substrate 1.

In the case where the impurity implantation is to be performed after the sidewall spacer 81 is formed, the sidewall spacer 81 is formed after the ion implantation. Therefore, heat treatment does not need to be performed during formation of the sidewall spacer 81. For example, if a nitride film is used as a main material, the sidewall spacer 81 is formed by using the low pressure CVD device at a temperature of 800° C. If TEOS is used as the main material, ozone is mixed with the TEOS to form the sidewall spacer 81 by using atmospheric CVD. While a thermal decomposition temperature of the TEOS is about 700° C., a formation temperature can be reduced to about 400° C. by using ozone having great oxidation force.

Since the heat treatment is not performed, the implanted ions do not cause thermal diffusion. Consequently, a lot of margin can be taken to fabricate a device having a small size. Also in this case, the spacer 90 is removed so that an interface state can be prevented from being generated.

Figure 40:
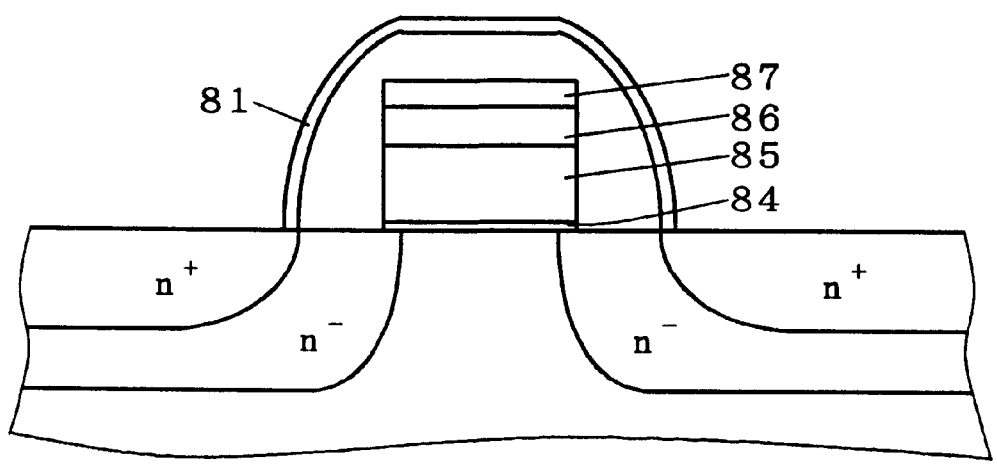
FIG. 40 is a partially sectional perspective view showing another example of the structure of the semiconductor integrated circuit according to the sixth embodiment.
Figure 41:
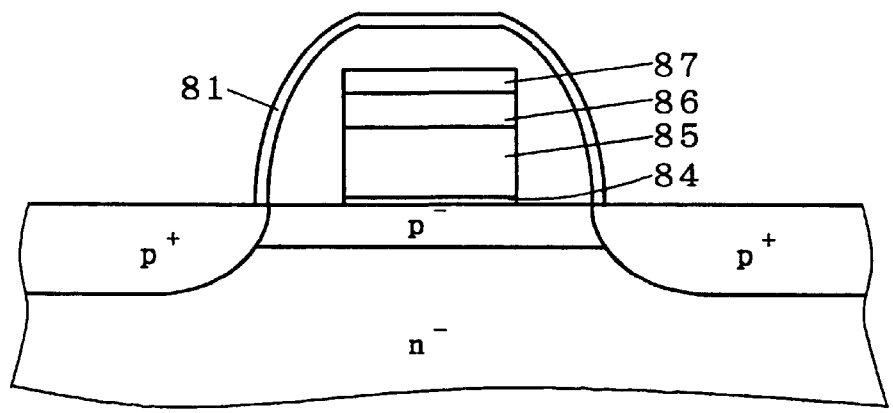
FIG. 41 is a partially sectional perspective view showing yet another example of the structure of the semiconductor integrated circuit according to the sixth embodiment.
Figure 42:
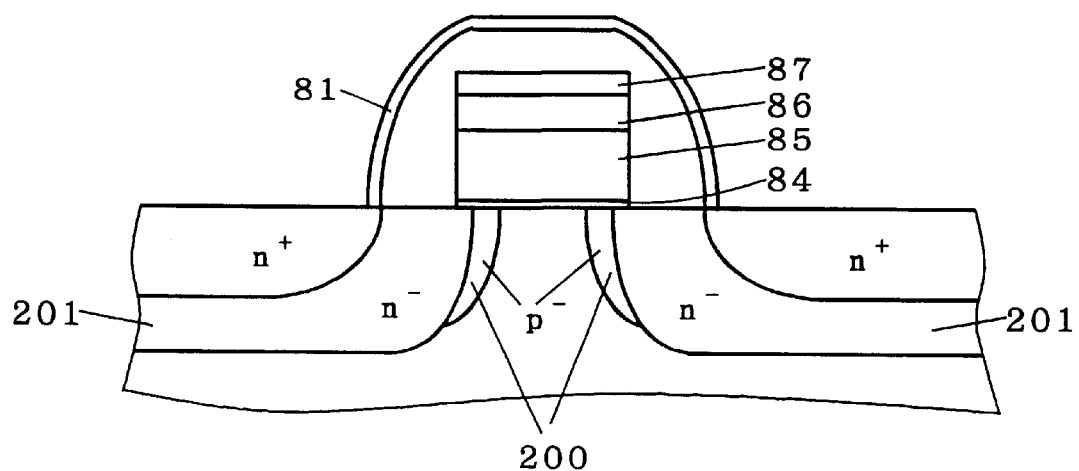
FIG. 42 is a partially sectional perspective view showing a further example of the structure of the semiconductor integrated circuit according to the sixth embodiment.

While the transistor having the LDD structure has been described above, it is apparent that the present invention can also be applied to a DDD (Double Doped Drain) structure (see FIG. 40), a buried channel structure (see FIG. 41) and a structure in which a pocket implantation layer is formed on the inside of all LDD layer and a DDD layer (see FIG. 42). In FIG. 42, a region indicated at 200 is the pocket implantation layer. For example, boron is diagonally rotated and implanted at an angle of 35° into a bate electrode structure in which an n⁻ layer 201 is formed. Thus, the pocket implantation layer 200 is formed.

Materials other than the nitride film can be applied to the sidewall 81. It is apparent that the same effects can be obtained even if the sidewall 81 is formed using other materials such as TEOS, $SiO_2$, polysilicon and the like. Furthermore, the sidewall 81 may have a two-layer structure of $TEOS/Si_3N_4$.

Seventh Embodiment

Figure 33:
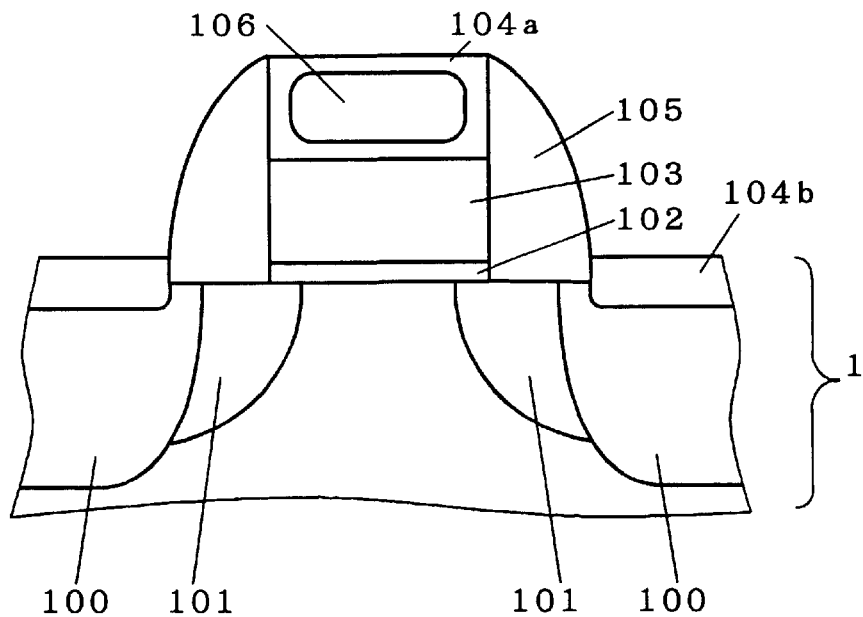
FIG. 33 is a typical view showing an example of a sectional structure of a semiconductor integrated circuit according to a seventh embodiment.

A semiconductor device according to a seventh embodiment will be described below with reference to FIG. 33. FIG. 33 shows a MOS transistor comprising source/drain regions 100 and 101 formed on a semiconductor substrate 1, a gate oxide film 102 formed on the semiconductor substrate 1, a polysilicon gate electrode 103 formed on the gate oxide film 102, titanium silicide 104a formed on the polysilicon gate electrode 103, and a sidewall spacer 105 formed on sidewalls of the gate oxide film 102, the polysilicon gate electrode 103 and the titanium silicide 104a.

The semiconductor device according to the seventh embodiment is characterized in that the titanium silicide 104a has a void 106 on the inside.

The void 106 formed in the titanium silicide 104a provided on the polysilicon gate electrode 103 relaxes stress on an end of a gate which causes a reduction in a mobility of carriers traveling in a channel. By preventing the mobility of the carriers from being reduced by the stress, a transistor having high driving force can be obtained. Furthermore, impurities contained in the polysilicon gate electrode 103 are taken into the titanium silicide 104a during formation of the titanium silicide 104a. Therefore, polysilicon is depleted. For this reason, a threshold voltage of the transistor is varied widely. However, the titanium silicide 104a has the void so that less impurities are taken into the titanium silicide 104a. Consequently a variation in the threshold voltage of the transistor is reduced.

A method for manufacturing the MOS transistor shown in FIG. 33 will be described below with reference to FIGS. 34 and 35. First of all, an oxide film having a thickness of about 0.01 μm, a doped polysilicon film having a thickness of about 0.05 μm and a nitride film having a thickness of about 0.05 μm are provided on a semiconductor substrate 1, and are then subjected to patterning. Consequently, stacked layers including a gate oxide film 102, a polysilicon gate electrode 103 and a nitride film 107 are formed. The stacked layers have a width of about 0.1 μm. By using the stacked layers as a mask, for example, arsenic ions are implanted so that a source/drain region 101 having a low impurity concentration is formed in self-alignment. Next, an oxide film is provided. Then, the oxide film is removed by anisotropic etching with a sidewall spacer 105 left. Thereafter, phosphorus ions are implanted by using the sidewall spacer 105 and the stacked layers as masks, for example. Consequently, a source/drain region 100 having a high impurity concentration is formed in self-alignment (see FIG. 34).

Figure 34:
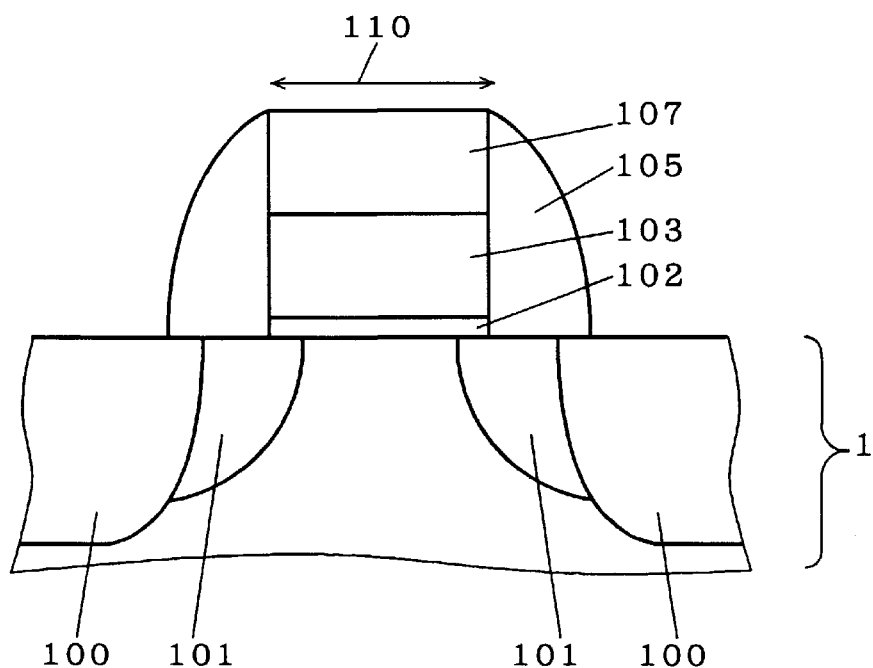
FIGS. 34 and 35 are typical views showing steps of manufacturing the semiconductor integrated circuit according to the seventh embodiment.

Subsequently, the nitride film 107 shown in FIG. 34 is removed lay etching. For example, titanium 108 is deposited over a principal plane of the semiconductor substrate 1 (see FIG. 35). If the titanium has a gate length of about 0.5 μm or less, an opening width shown by all arrow 110 (a width of a space formed b removing the nitride film 107) is small. Therefore, a film having a thickness of 0.02 μm is provided in 40 minutes at a temperature of 300° C. by using a gas such as titanium chloride ($TiCl_4$) by means of a CVD system so that a void 106 can be formed on the gate electrode 103.

Figure 35:
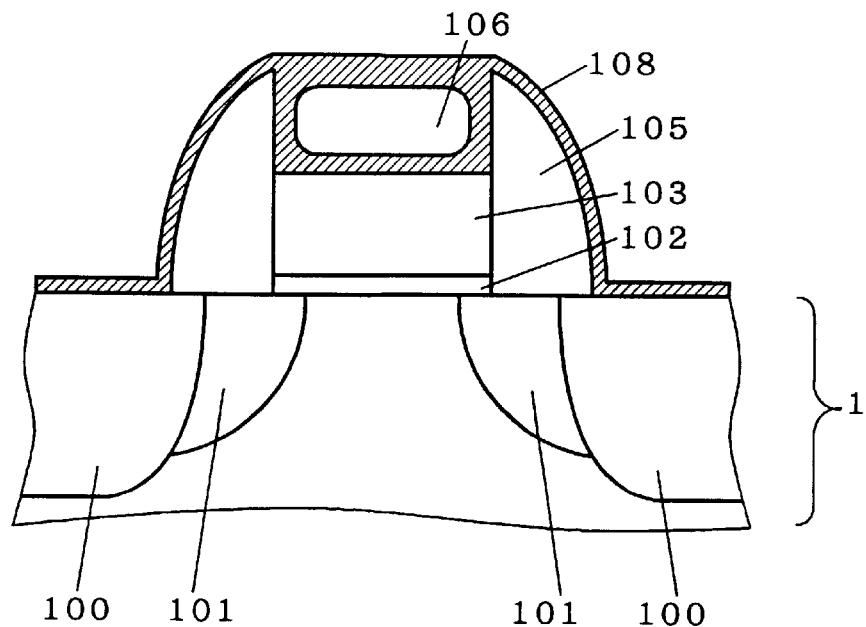
Figure 36:
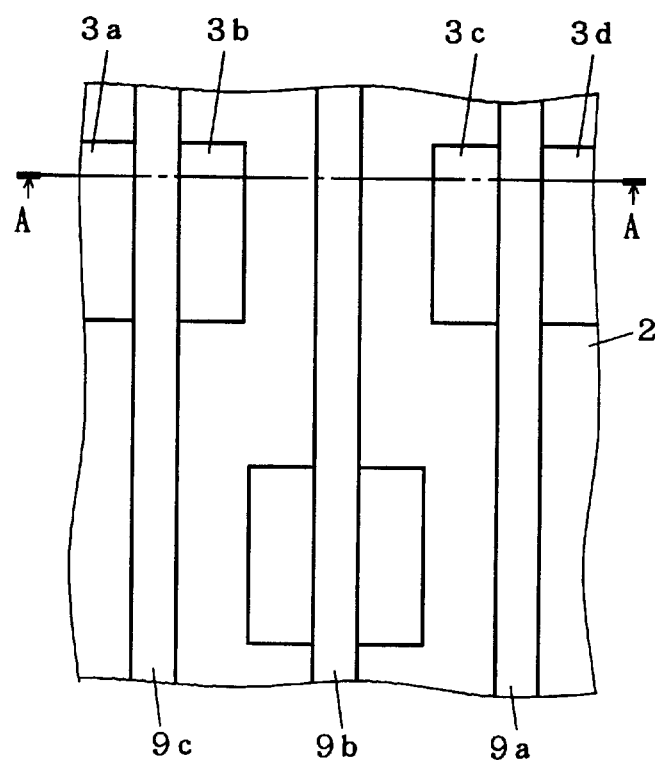
FIG. 36 is a layout showing an example of a planar structure of a semiconductor integrated circuit according to the prior art.
Figure 37:
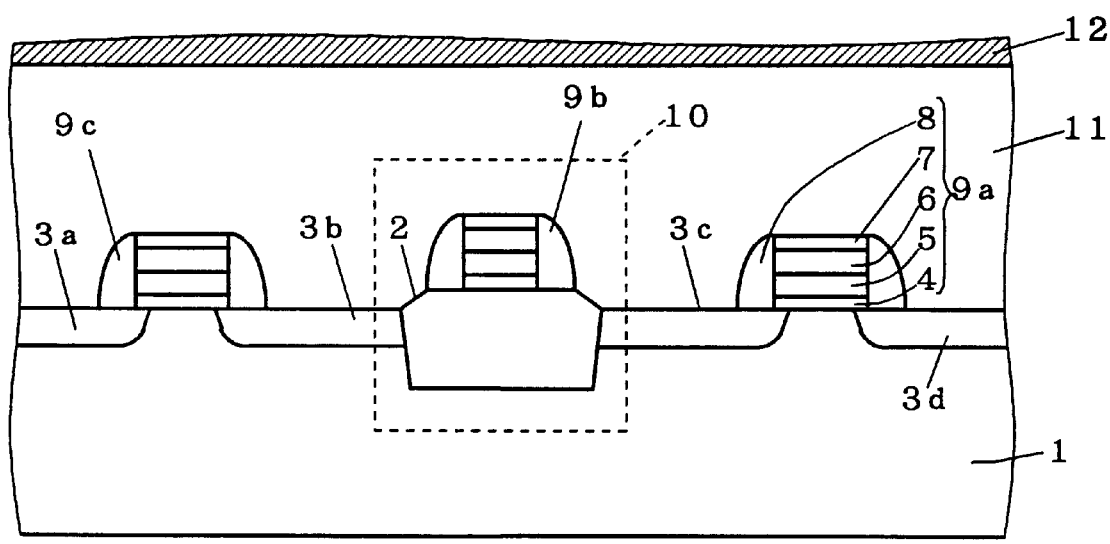
FIG. 37 is a typical view showing an example of a sectional structure of the semiconductor integrated circuit according to the prior art.

When a semiconductor device shown in FIG. 35 is subjected to heat treatment by RTA, titanium which is in contact with silicon chemically reacts so that titanium silicide 104a and 104b are formed. The titanium reacts to neither a silicon oxide film nor a silicon nitride film. Therefore, the titanium silicide 104a and 104b are formed in self-alignment on the gate electrode 103 and the source/drain region 100 of the transistor, respectively. When unreacted titanium remaining on the oxide film is removed by etching, the gate electrode 103 and the source/drain region 100 which have low resistances can be obtained because the titanium silicide 104a and 104b have low resistances.

While the titanium has been used for a metal film having a void formed thereon in the above-mentioned embodiment, refractory metal such as Ni, W, Co or the like can also be used to obtain the same effects.

While the invention has been described in detail, the foregoing description is in all aspects illustrative and not restrictive. It is understood that numerous other modifications and variations can be devised without departing from the scope of the invention.

I claim:

1. A method for manufacturing a semiconductor integrated circuit, comprising the steps of:

forming an insulation film on a principal plane of a semiconductor substrate;

forming a reflow glass on said insulation film;

forming, on said principal plane, an isolation trench having a bottom face inside said semiconductor substrate through said reflow glass and said insulation film; and sealing said isolation trench above said bottom face to form a cavity in said trench by causing said reflow glass to be subjected to reflow.

2. The method for manufacturing a semiconductor integrated circuit according to claim 1, wherein said reflow glass is a boron phosphosilicate glass.

* * * * *

UNITED STATES PATENT AND TRADEMARK OFFICE
CERTIFICATE OF CORRECTION

PATENT NO. : 6,620,703 B2
DATED : September 16, 2003
INVENTOR(S) : Kunikiyo

It is certified that error appears in the above-identified patent and that said Letters Patent is hereby corrected as shown below:

<u>Title page, Item [54] and Column 1, lines 1-5,</u>
Title, should read -- [54] A METHOD OF FORMING AN INTEGRATED CIRCUIT USING AN ISOLATION TRENCH HAVING A CAVITY --

<u>Title page,</u>
Item [75], Inventor, should read -- [75]   Inventor:  Tatsuya Kunikiyo, Tokyo (JP) --

Signed and Sealed this

Sixth Day of January, 2004

JAMES E. ROGAN
*Director of the United States Patent and Trademark Office*